United States Patent
Leonard et al.

(10) Patent No.: US 11,599,685 B2
(45) Date of Patent: *Mar. 7, 2023

(54) DETECTION AND USE OF PRINTER CONFIGURATION INFORMATION

(71) Applicant: Stratasys, Inc., Eden Prairie, MN (US)

(72) Inventors: Alison N. Leonard, Brooklyn, NY (US); Joseph Sadusk, New York, NY (US)

(73) Assignee: Stratasys, Inc., Eden Prairie, MN (US)

( * ) Notice: Subject to any disclaimer, the term of this patent is extended or adjusted under 35 U.S.C. 154(b) by 96 days.

This patent is subject to a terminal disclaimer.

(21) Appl. No.: 17/239,885

(22) Filed: Apr. 26, 2021

(65) Prior Publication Data

US 2021/0279374 A1 Sep. 9, 2021

Related U.S. Application Data

(63) Continuation of application No. 16/576,044, filed on Sep. 19, 2019, now Pat. No. 10,987,878, which is a continuation of application No. 14/587,548, filed on Dec. 31, 2014, now Pat. No. 10,421,238.

(51) Int. Cl.
*G06F 30/00* (2020.01)
*G05B 15/02* (2006.01)
*B29C 64/393* (2017.01)
*B33Y 50/02* (2015.01)

(52) U.S. Cl.
CPC ............ *G06F 30/00* (2020.01); *B29C 64/393* (2017.08); *G05B 15/02* (2013.01); *B33Y 50/02* (2014.12)

(58) Field of Classification Search
USPC ........................................................... 700/98
See application file for complete search history.

(56) References Cited

U.S. PATENT DOCUMENTS

| 6,227,643 | B1 | 5/2001 | Purcell et al. |
| 7,052,103 | B2 | 5/2006 | Silverbrook et al. |
| 7,639,253 | B2 | 12/2009 | Bae et al. |

(Continued)

OTHER PUBLICATIONS

Indiegogo, Inc., "PrintToPeer: Your 3D Printer on the Web", https://www.indiegogo.com/projects/printtopeer-your-3d-printer-on-the-web#/story 2015, 21 pages (Year: 2015).*

(Continued)

*Primary Examiner* — Mohammad Ali
*Assistant Examiner* — Joshua T Sanders
(74) *Attorney, Agent, or Firm* — Westman, Champlin & Koehler, P.A.

(57) ABSTRACT

The hardware and software properties of a three-dimensional printer can be queried and applied to select suitable directly printable models for the printer, or to identify situations where a new machine-ready model must be generated. The properties may be any properties relevant to fabrication including, e.g., physical properties of the printer, printer firmware, user settings, hardware configurations, and so forth. A printer may respond to configuration queries with a dictionary of capabilities or properties, and this dictionary may be used to select suitable models, or determine when a new model must be created. Similarly, when a printable model is sent to the printer, metadata for the printable model may be compared to printer properties in the dictionary to ensure that the model can be fabricated by the printer.

20 Claims, 7 Drawing Sheets

(56) References Cited

U.S. PATENT DOCUMENTS

| | | | |
|---|---|---|---|
| 10,421,238 B2* | 9/2019 | Leonard | B29C 64/393 |
| 10,987,878 B2* | 4/2021 | Leonard | G06F 30/00 |
| 2007/0233298 A1 | 10/2007 | Heide et al. | |
| 2013/0329258 A1* | 12/2013 | Pettis | B33Y 30/00 |
| | | | 358/1.15 |
| 2014/0156053 A1 | 6/2014 | Mahdavi et al. | |
| 2015/0331402 A1 | 11/2015 | Lin et al. | |
| 2016/0185044 A1 | 6/2016 | Leonard et al. | |
| 2020/0009793 A1 | 1/2020 | Leonard et al. | |

OTHER PUBLICATIONS

Stratasys Inc., "Stratasys Production Scheduling Software Ensures Efficiency in Direct Digital Manufacturing", Jul. 30, 2007, 2 pages.

Gigasavvy, "Getting Started with Airwolf 3D Printer SLIC3R Configurations", https://airwolf3d.com/question/3d-printer-slic3r-configurations/Jan. 21, 2013, 12 Pages.

3Dagogo, "AstroPrint: Wireless 3D Printing Software", Kickstarter; Retrieved from Khttp:web.archive.org/web/20140526152845/https://kickstarter.com/projects/306530051/astroprinttm-wireless-3d-printing-software. May 26, 14, 11 pages.

Astroprint, "Cloud OS for Desktop 3D Printers", https://www.astroprint.com/2015, 5 Pages.

Indiegogo, Inc., "PrintToPeer: Your 3D Printer on the Web", https://www.indiegogo.com/projects/printtopeer-your-3d-printer-on-the-web#/story 2015, 21 pages.

Solidscape, Inc., "Solidscape Element DLL Developer's Manual", Copyright 2014 by Solidscape Inc. a Stratasys Company 316 DW Highway, Merrimack NH 03054, USA 2014, 71 pages.

USPTO, "U.S. Appl. No. 14/587,548 Final Office Action dated Dec. 26, 2018", 24 pages.

USPTO, "U.S. Appl. No. 14/587,548 Non-Final Office Action dated May 31, 2018", 24 pages.

USPTO, "U.S. Appl. No. 14/587,548 Notice of Allowance dated May 16, 2019", 11 pages.

USPTO, "U.S. Appl. No. 16/576,044 Non-Final Office Action dated Oct. 5, 2020", 15 pages.

USPTO, "U.S. Appl. No. 16/576,044 Notice of Allowance dated Dec. 30, 2020", 11 pages.

USPTO, "U.S. Appl. No. 14/587,548, Final Office Action dated Aug. 23, 2017", 23 pages.

USPTO, "U.S. Appl. No. 14/587,548, Non-Final Office Action dated Dec. 29, 2016", 23 pages.

* cited by examiner

DETECTION AND USE OF PRINTER CONFIGURATION INFORMATION

CROSS-REFERENCE TO RELATED APPLICATIONS

This application is a continuation of U.S. patent application Ser. No. 16/576,044 filed on Sep. 19, 2019, which is a continuation of U.S. patent application Ser. No. 14/587,548 filed on Dec. 31, 2014 (now U.S. Pat. No. 10,421,238), where the entire content of each of the foregoing is hereby incorporated by reference.

TECHNICAL FIELD

The present disclosure generally relates to the use of configuration information for a three-dimensional printer to select suitable machine-ready models.

BACKGROUND

Generally, three-dimensional printers execute machine-ready representations of three-dimensional models for fabricating objects. These machine-ready models are typically dependent on the configuration or properties of the three-dimensional printers, e.g., the hardware configuration, software configuration, user settings, firmware version(s) and so forth. While a three-dimensional printer may know its own hardware and software configuration, a service providing machine-ready models may not. There remains a need for providing machine-ready models based on a three-dimensional printer's configuration, and for improved matching of models to printers.

SUMMARY

The hardware and software properties of a three-dimensional printer can be queried and applied to select suitable directly printable models for the printer, or to identify situations where a new machine-ready model must be generated. The properties may be any properties relevant to fabrication including, e.g., physical properties of the printer, printer firmware, user settings, hardware configurations, and so forth. A printer may respond to configuration queries with a dictionary of capabilities or properties, and this dictionary may be used to select suitable models, or determine when a new model must be created. Similarly, when a printable model is sent to the printer, metadata for the printable model may be compared to printer properties in the dictionary to ensure that the model can be fabricated by the printer.

BRIEF DESCRIPTION OF THE DRAWINGS

The foregoing and other objects, features and advantages of the devices, systems, and methods described herein will be apparent from the following description of particular embodiments thereof, as illustrated in the accompanying drawings. The drawings are not necessarily to scale, emphasis instead being placed upon illustrating the principles of the devices, systems, and methods described herein.

DETAILED DESCRIPTION

Figure 1:
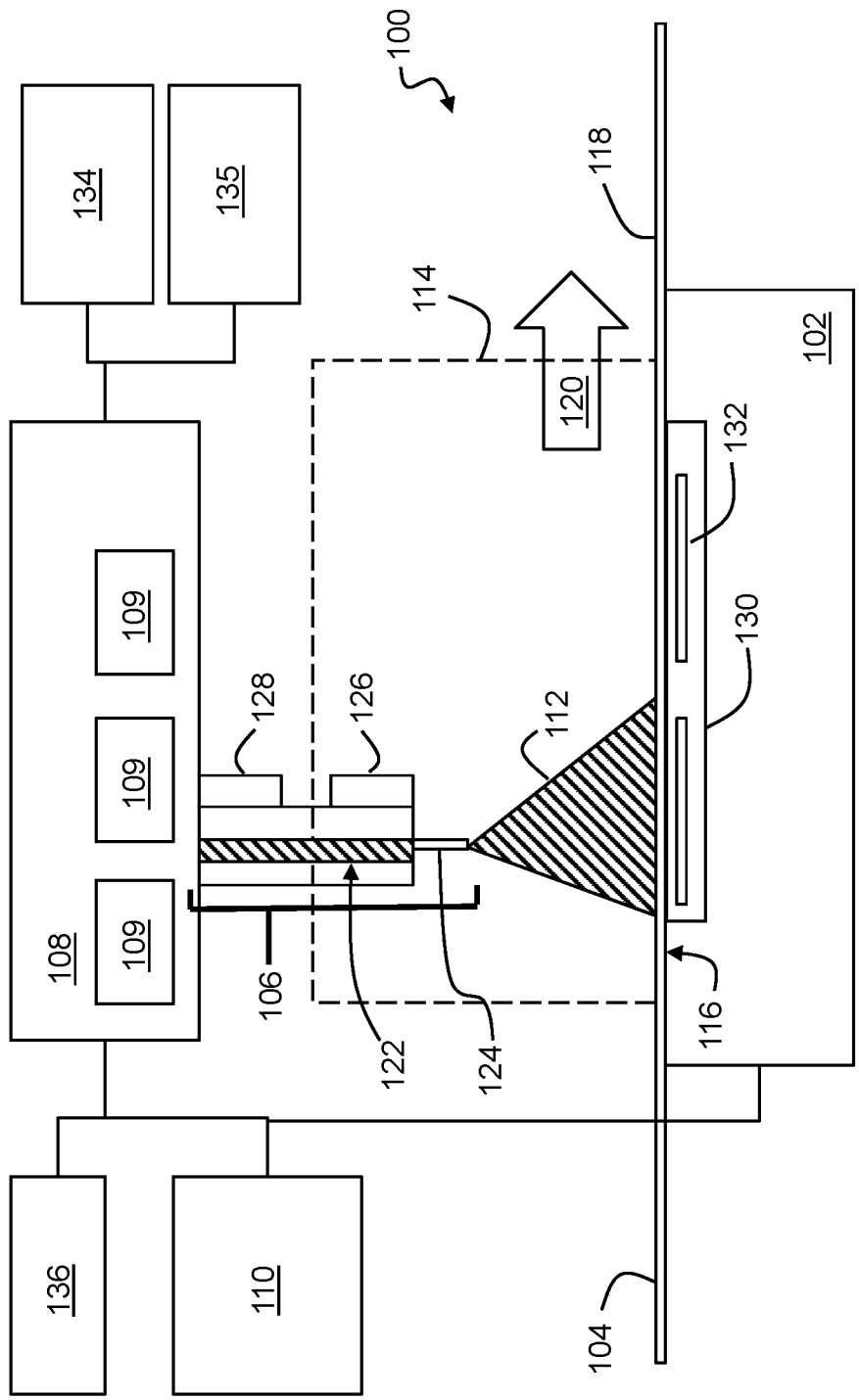
FIG. 1 is a block diagram of a three-dimensional printer.

The embodiments will now be described more fully hereinafter with reference to the accompanying figures, in which preferred embodiments are shown. The foregoing may, however, be embodied in many different forms and should not be construed as limited to the illustrated embodiments set forth herein.

All documents mentioned herein are hereby incorporated by reference in their entirety. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

Recitation of ranges of values herein are not intended to be limiting, referring instead individually to any and all values falling within the range, unless otherwise indicated herein, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

In the following description, it is understood that terms such as "first," "second," "top," "bottom," "above," "below," and the like, are words of convenience and are not to be construed as limiting terms.

Described herein are devices, systems, and methods for providing machine-ready models based on a printer's configuration in three-dimensional fabrication systems. It will be understood that while the exemplary embodiments below may emphasize three-dimensional fabrication systems using extrusion, the principles of the invention may be adapted to a wide variety of three-dimensional fabrication processes or other processes where instructions for physical steps are created based on assumptions about a machine that is being controlled. This may include a variety of three-dimensional fabrication systems such as selective laser sintering systems, fused deposition modeling systems, stereolithography systems, and other three-dimensional printing systems, as well as automated fabrication lines, robotics systems, and so forth. Other systems that can be adapted for use with the techniques as described herein are also intended to fall within the scope of this disclosure. It should also be understood that any reference herein to a fabrication process such as printing or three-dimensional printing is intended to refer to any and all such additive fabrication processes unless a different meaning is explicitly stated or otherwise clear from the context. Thus, by way of example and not of limitation, a three-dimensional printer (or simply "printer") that may be adapted for use in a system providing machine-ready models based on the printer's configuration is described with reference to FIG. 1.

FIG. 1 is a block diagram of a three-dimensional printer. In general, the printer 100 may include a build platform 102, a conveyor 104, an extruder 106, an x-y-z positioning assembly 108, and a controller 110 that cooperate to fabricate an object 112 within a working volume 114 of the printer 100.

The build platform 102 may include a surface 116 that is rigid and substantially planar. The surface 116 may support the conveyer 104 in order to provide a fixed, dimensionally and positionally stable platform on which to build the object 112.

The build platform 102 may include a thermal element 130 that controls the temperature of the build platform 102 through one or more active devices 132 such as resistive elements that convert electrical current into heat, Peltier effect devices that can create a heating or cooling effect, or any other thermoelectric heating and/or cooling devices. Thus the thermal element 130 may be a heating element that provides active heating to the build platform 102, a cooling element that provides active cooling to the build platform 102, or a combination of these. The heating element 130 may be coupled in a communicating relationship with the controller 110 in order for the controller 110 to controllably impart heat to or remove heat from the surface 116 of the build platform 102. Thus the thermal element 130 may include an active cooling element positioned within or adjacent to the build platform 102 to controllably cool the build platform 102.

It will be understood that a variety of other techniques may be employed to control a temperature of the build platform 102. For example, the build platform 102 may use a gas cooling or gas heating device such as a vacuum chamber or the like in an interior thereof, which may be quickly pressurized to heat the build platform 102 or vacated to cool the build platform 102 as desired. As another example, a stream of heated or cooled gas may be applied directly to the build platform 102 before, during, and/or after a build process. Any device or combination of devices suitable for controlling a temperature of the build platform 102 may be adapted to use as the thermal element 130 described herein.

The conveyer 104 may be formed of a sheet 118 of material that moves in a path 120 through the working volume 114. Within the working volume 114, the path 120 may pass proximal to the surface 116 of the build platform 102—that is, resting directly on or otherwise supported by the surface 116—in order to provide a rigid, positionally stable working surface for a build. It will be understood that while the path 120 is depicted as a unidirectional arrow, the path 120 may be bidirectional, such that the conveyer 104 can move in either of two opposing directions through the working volume 114. It will also be understood that the path 120 may curve in any of a variety of ways, such as by looping underneath and around the build platform 102, over and/or under rollers, or around delivery and take up spools for the sheet 118 of material. Thus, while the path 120 may be generally (but not necessarily) uniform through the working volume 114, the conveyer 104 may move in any direction suitable for moving completed items from the working volume 114. The conveyor may include a motor or other similar drive mechanism (not shown) coupled to the controller 110 to control movement of the sheet 118 of material along the path 120. Various drive mechanisms are shown and described in further detail below.

In general, the sheet 118 may be formed of a flexible material such as a mesh material, a polyamide, a polyethylene terephthalate (commercially available in bi-axial form as MYLAR), a polyimide film (commercially available as KAPTON), or any other suitably strong polymer or other material. The sheet 118 may have a thickness of about three to seven thousandths of an inch, or any other thickness that permits the sheet 118 to follow the path 120 of the conveyer 104. For example, with sufficiently strong material, the sheet 118 may have a thickness of one to three thousandths of an inch. The sheet 118 may instead be formed of sections of rigid material joined by flexible links.

A working surface of the sheet 118 (e.g., an area on the top surface of the sheet 118 within the working volume 114) may be treated in a variety of manners to assist with adhesion of build material to the surface 118 and/or removal of completed objects from the surface 118. For example, the working surface may be abraded or otherwise textured (e.g., with grooves, protrusions, and the like) to improve adhesion between the working surface and the build material.

A variety of chemical treatments may be used on the working surface of the sheet 118 of material to further facilitate build processes as described herein. For example, the chemical treatment may include a deposition of material that can be chemically removed from the conveyer 104 by use of water, solvents, or the like. This may facilitate separation of a completed object from the conveyer by dissolving the layer of chemical treatment between the object 112 and the conveyor 104. The chemical treatments may include deposition of a material that easily separates from the conveyer such as a wax, mild adhesive, or the like. The chemical treatment may include a detachable surface such as an adhesive that is sprayed on to the conveyer 104 prior to fabrication of the object 112.

In one aspect, the conveyer 104 may be formed of a sheet of disposable, one-use material that is fed from a dispenser and consumed with each successive build.

In one aspect, the conveyer 104 may include a number of different working areas with different surface treatments adapted for different build materials or processes. For example, different areas may have different textures (smooth, abraded, grooved, etc.). Different areas may be formed of different materials. Different areas may also have or receive different chemical treatments. Thus a single conveyer 104 may be used in a variety of different build processes by selecting the various working areas as needed or desired.

The extruder 106 may include a chamber 122 in an interior thereof to receive a build material. The build material may, for example, include acrylonitrile butadiene styrene ("ABS"), high-density polyethylene ("HDPL"), polylactic acid, or any other suitable plastic, thermoplastic, or other material that can usefully be extruded to form a three-dimensional object. The extruder 106 may include an extrusion tip 124 or other opening that includes an exit port with a circular, oval, slotted or other cross-sectional profile that extrudes build material in a desired cross-sectional shape.

The extruder 106 may include a heater 126 to melt thermoplastic or other meltable build materials within the chamber 122 for extrusion through an extrusion tip 124 in liquid form. While illustrated in block form, it will be understood that the heater 126 may include, e.g., coils of resistive wire wrapped about the extruder 106, one or more heating blocks with resistive elements to heat the extruder 106 with applied current, an inductive heater, or any other arrangement of heating elements suitable for creating heat within the chamber 122 to melt the build material for extrusion. The extruder 106 may also or instead include a motor 128 or the like to push the build material into the chamber 122 and/or through the extrusion tip 124.

In general operation (and by way of example rather than limitation), a build material such as ABS plastic in filament form may be fed into the chamber 122 from a spool or the like by the motor 128, melted by the heater 126, and extruded from the extrusion tip 124. By controlling a rate of the motor 128, the temperature of the heater 126, and/or other process parameters, the build material may be extruded at a controlled volumetric rate. It will be understood that a variety of techniques may also or instead be employed to deliver build material at a controlled volumetric rate, which may depend upon the type of build material, the volumetric rate desired, and any other factors. All such techniques that might be suitably adapted to delivery of build material for fabrication of a three-dimensional object are intended to fall within the scope of this disclosure. As noted above, other techniques may be employed for three-dimensional printing, including extrusion-based techniques using a build material that is curable and/or a build material of sufficient viscosity to retain shape after extrusion.

The x-y-z positioning assembly 108 may generally be adapted to three-dimensionally position the extruder 106 and the extrusion tip 124 within the working volume 114. Thus by controlling the volumetric rate of delivery for the build material and the x, y, z position of the extrusion tip 124, the object 112 may be fabricated in three dimensions by depositing successive layers of material in two-dimensional patterns derived, for example, from cross-sections of a computer model or other computerized representation of the object 112. A variety of arrangements and techniques are known in the art to achieve controlled linear movement along one or more axes. The x-y-z positioning assembly 108 may, for example, include a number of stepper motors 109 to independently control a position of the extruder within the working volume along each of an x-axis, a y-axis, and a z-axis. More generally, the x-y-z positioning assembly 108 may include without limitation various combinations of stepper motors, encoded DC motors, gears, belts, pulleys, worm gears, threads, and so forth. Any such arrangement suitable for controllably positioning the extruder 106 within the working volume 114 may be adapted to use with the printer 100 described herein.

By way of example and not limitation, the conveyer 104 may be affixed to a bed that provides x-y positioning within the plane of the conveyer 104, while the extruder 106 can be independently moved along a z-axis. As another example, the extruder 106 may be stationary while the conveyer 104 is x, y, and z positionable. As another example, the extruder 106 may be x, y, and z positionable while the conveyer 104 remains fixed (relative to the working volume 114). In yet another example, the conveyer 104 may, by movement of the sheet 118 of material, control movement in one axis (e.g., the y-axis), while the extruder 106 moves in the z-axis as well as one axis in the plane of the sheet 118. Thus in one aspect, the conveyer 104 may be attached to and move with at least one of an x-axis stage (that controls movement along the x-axis), a y-axis stage (that controls movement along a y-axis), and a z-axis stage (that controls movement along a z-axis) of the x-y-z positioning assembly 108. More generally, any arrangement of motors and other hardware controllable by the controller 110 may serve as the x-y-z positioning assembly 108 in the printer 100 described herein. Still more generally, while an x, y, z coordinate system serves as a convenient basis for positioning within three dimensions, any other coordinate system or combination of coordinate systems may also or instead be employed, such as a positional controller and assembly that operates according to cylindrical or spherical coordinates.

The controller 110 may be electrically coupled in a communicating relationship with the build platform 102, the conveyer 104, the x-y-z positioning assembly 108, and the other various components of the printer 100. In general, the controller 110 is operable to control the components of the printer 100, such as the build platform 102, the conveyer 104, the x-y-z positioning assembly 108, and any other components of the printer 100 described herein to fabricate the object 112 from the build material. The controller 110 may include any combination of software and/or processing circuitry suitable for controlling the various components of the printer 100 described herein including without limitation microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and so forth. In one aspect, the controller 110 may include a microprocessor or other processing circuitry with sufficient computational power to provide related functions such as executing an operating system, providing a graphical user interface (e.g., to a display coupled to the controller 110 or printer 100), convert three-dimensional models into tool instructions, and operate a web server or otherwise host remote users and/or activity through the network interface 136 described below.

A variety of additional sensors may be usefully incorporated into the printer 100 described above. These are generically depicted as sensor 134 in FIG. 1, for which the positioning and mechanical/electrical interconnections with other elements of the printer 100 will depend upon the type and purpose of the sensor 134 and will be readily understood and appreciated by one of ordinary skill in the art. The sensor 134 may include a temperature sensor positioned to sense a temperature of the surface of the build platform 102. This may, for example, include a thermistor or the like embedded within or attached below the surface of the build platform 102. This may also or instead include an infrared detector or the like directed at the surface 116 of the build platform 102 or the sheet 118 of material of the conveyer 104. Other sensors that may be usefully incorporated into the printer 100 as the sensor 134 include a heat sensor, a volume flow rate sensor, a weight sensor, a sound sensor, and a light sensor. Certain more specific examples are provided below by way of example and not of limitation.

The sensor 134 may include a sensor to detect a presence (or absence) of the object 112 at a predetermined location on the conveyer 104. This may include an optical detector arranged in a beam-breaking configuration to sense the presence of the object 112 at a location such as an end of the conveyer 104. This may also or instead include an imaging device and image processing circuitry to capture an image of the working volume 114 and analyze the image to evaluate a position of the object 112. This sensor 134 may be used for example to ensure that the object 112 is removed from the conveyer 104 prior to beginning a new build at that location on the working surface such as the surface 116 of the build platform 102. Thus the sensor 134 may be used to determine whether an object is present that should not be, or to detect when an object is absent. The feedback from this sensor 134 may be used by the controller 110 to issue processing interrupts or otherwise control operation of the printer 100.

The sensor 134 may include a sensor that detects a position of the conveyer 104 along the path. This information may be obtained from an encoder in a motor that drives the conveyer 104, or using any other suitable technique such as a visual sensor and corresponding fiducials (e.g., visible patterns, holes, or areas with opaque, specular, transparent, or otherwise detectable marking) on the sheet 118.

The sensor 134 may include a heater (instead of or in addition to the thermal element 130) to heat the working volume 114 such as a radiant heater or forced hot air to maintain the object 112 at a fixed, elevated temperature throughout a build. The sensor 134 may also or instead include a cooling element to maintain the object 112 at a predetermined sub-ambient temperature throughout a build.

The sensor 134 may also or instead include at least one video camera. The video camera may generally capture images of the working volume 114, the object 112, or any other hardware associated with the printer 100. The video camera may provide a remote video feed through the network interface 136, which feed may be available to remote users through a user interface maintained by, e.g., remote hardware such as a three-dimensional print server, or within a web page provided by a web server hosted by the three-dimensional printer 100. Thus in one aspect there is disclosed herein a user interface adapted to present a video feed from at least one video camera of a three-dimensional printer to a remote user through a user interface.

The sensor 134 may also include more complex sensing and processing systems or subsystems, such as a three-dimensional scanner using optical techniques (e.g., stereoscopic imaging, or shape from motion imaging), structured light techniques, or any other suitable sensing and processing hardware that might extract three-dimensional information from the working volume 114. In another aspect, the sensor 134 may include a machine vision system that captures images and analyzes image content to obtain information about the status of a job, working volume 114, or an object 112 therein. The machine vision system may support a variety of imaging-based automatic inspection, process control, and/or robotic guidance functions for the three-dimensional printer 100 including without limitation pass/fail decisions, error detection (and corresponding audible or visual alerts), shape detection, position detection, orientation detection, collision avoidance, and so forth.

Other components, generically depicted as other hardware 135, may also be included, such as input devices including a keyboard, touchpad, mouse, switches, dials, buttons, motion sensors, and the like, as well as output devices such as a display, a speaker or other audio transducer, light emitting diodes, and so forth. Other hardware 135 may also or instead include a variety of cable connections and/or hardware adapters for connecting to, e.g., external computers, external hardware, external instrumentation or data acquisition systems, and so forth.

The printer 100 may include, or be connected in a communicating relationship with, a network interface 136. The network interface 136 may include any combination of hardware and software suitable for coupling the controller 110 and other components of the printer 100 to a remote computer in a communicating relationship through a data network. By way of example and not limitation, this may include electronics for a wired or wireless Ethernet connection operating according to the IEEE 802.11 standard (or any variation thereof), or any other short or long range wireless networking components or the like. This may include hardware for short range data communications such as BlueTooth or an infrared transceiver, which may be used to couple into a local area network or the like that is in turn coupled to a data network such as the Internet. This may also or instead include hardware/software for a WiMax connection or a cellular network connection (using, e.g., CDMA, GSM, LTE, or any other suitable protocol or combination of protocols). Consistently, the controller 110 may be configured to control participation by the printer 100 in any network to which the network interface 136 is connected, such as by autonomously connecting to the network to retrieve printable content, or responding to a remote request for status or availability.

Figure 2:
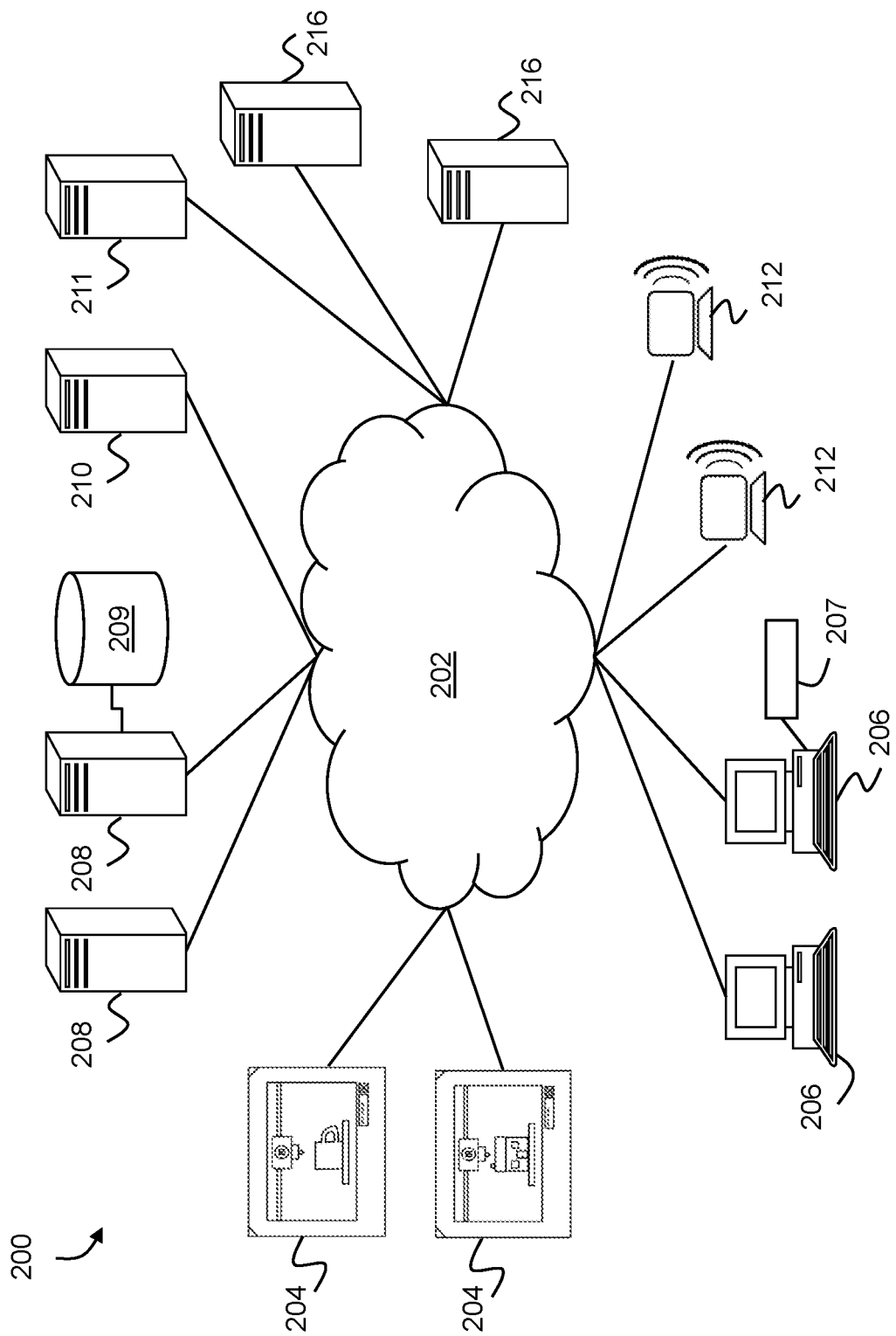
FIG. 2 depicts a networked three-dimensional printing environment.

FIG. 2 depicts a networked three-dimensional printing environment. In general, the environment 200 may include a data network 202 interconnecting a plurality of participating devices in a communicating relationship. The participating devices may, for example, include any number of three-dimensional printers 204 (also referred to interchangeably herein as "printers"), client devices 206, print servers 208, content sources 210, mobile devices 212, and other resources 216.

The data network 202 may be any network(s) or inter-network(s) suitable for communicating data and control information among participants in the environment 200. This may include public networks such as the Internet, private networks, telecommunications networks such as the Public Switched Telephone Network or cellular networks using third generation (e.g., 3G or IMT-2000), fourth generation (e.g., LTE (E-UTRA) or WiMax-Advanced (IEEE 802.16m)) and/or other technologies, as well as any of a variety of corporate area or local area networks and other switches, routers, hubs, gateways, and the like that might be used to carry data among participants in the environment 200.

The three-dimensional printers 204 may be any computer-controlled devices for three-dimensional fabrication, including without limitation any of the three-dimensional printers or other fabrication or prototyping devices described above. In general, each such device may include a network interface comprising, e.g., a network interface card, which term is used broadly herein to include any hardware (along with software, firmware, or the like to control operation of same) suitable for establishing and maintaining wired and/or wireless communications. The network interface card may include without limitation wired Ethernet network interface cards ("NICs"), wireless 802.11 networking cards, wireless 802.11 USB devices, or other hardware for wireless local area networking. The network interface may also or instead include cellular network hardware, wide area wireless network hardware or any other hardware for centralized, ad hoc, peer-to-peer, or other radio communications that might be used to carry data. In another aspect, the network interface may include a serial or USB port to directly connect to a computing device such as a desktop computer that, in turn, provides more general network connectivity to the data network 202.

The printers 204 might be made to fabricate any object, practical or otherwise, that is amenable to fabrication according to each printer's capabilities. This may be a model of a house or a tea cup, as depicted, or any other object such as gears or other machine hardware, replications of scanned three-dimensional objects, or fanciful works of art.

Client devices 206 may be any devices within the environment 200 operated by users to initiate, manage, monitor, or otherwise interact with print jobs at the three-dimensional printers 204. This may include desktop computers, laptop computers, network computers, tablets, or any other computing device that can participate in the environment 200 as contemplated herein. Each client device 206 generally provides a user interface, which may include a graphical user interface, a text or command line interface, a voice-controlled interface, and/or a gesture-based interface to control operation of remote three-dimensional printers 204. The user interface may be maintained by a locally executing application on one of the client devices 206 that receives data and status information from, e.g., the printers 204 and print servers 208 concerning pending or executing print jobs. The user interface may create a suitable display on the client device 206 for user interaction. In other embodiments, the user interface may be remotely served and presented on one of the client devices 206, such as where a print server 208 or one of the three-dimensional printers 204 includes a web server that provides information through one or more web pages or the like that can be displayed within a web browser or similar client executing on one of the client devices 206. In one aspect, the user interface may include a voice controlled interface that receives spoken commands from a user and/or provides spoken feedback to the user.

A client device 206 may, for example include a removable memory device 207 such as a USB drive, memory stick, or the like, which may be used for example to transfer digital models of three-dimensional objects to printers 204.

The print servers 208 may include data storage, a network interface, and a processor and/or other processing circuitry. In the following description, where the functions or configuration of a print server 208 are described, this is intended to include corresponding functions or configuration (e.g., by programming) of a processor of the print server 208. In general, the print servers 208 (or processors thereof) may perform a variety of processing tasks related to management of networked printing. For example, the print servers 208 may manage print jobs received from one or more of the client devices 206, and provide related supporting functions such as content search and management. A print server 208 may also include a web server that provides web-based access by the client devices 206 to the capabilities of the print server 208. A print server 208 may also communicate periodically with three-dimensional printers 204 in order to obtain status information concerning, e.g., availability of printers and/or the status of particular print jobs, any of which may be subsequently presented to a user through the web server or any other suitable interface. A print server 208 may also maintain a list of available three-dimensional printers 204, and may automatically select one of the three-dimensional printers 204 for a user-submitted print job, or may permit a user to specify a single printer, or a group of preferred printers, for fabricating an object. Where the print server 208 selects the printer automatically, any number of criteria may be used such as geographical proximity, printing capabilities, current print queue, fees (if any) for use of a particular three-dimensional printer 204, and so forth. Where the user specifies criteria, this may similarly include any relevant aspects of three-dimensional printers 204, and may permit use of absolute criteria (e.g., filters) or preferences, which may be weighted preferences or unweighted preferences, any of which may be used by a print server 208 to allocate a print job to a suitable resource.

In one aspect, the print server 208 may be configured to support interactive voice control of one of the printers 204. For example, the print server 208 may be configured to receive a voice signal (e.g., in digitized audio form) from a microphone or other audio input of the printer 204, and to process the voice signal to extract relevant content such as a command for the printer. Where the command is recognized as a print command, the voice signal may be further processed to extract additional context or relevant details. For example, the voice signal may be processed to extract an object identifier that specifies an object for printing, e.g., by filename, file metadata, or semantic content. The voice signal may also be processed to extract a dimensional specification, such as a scale or absolute dimension for an object. The print server 208 may then generate suitable control signals for return to the printer 204 to cause the printer 204 to fabricate the object. Where an error or omission is detected, the print server 208 may return a request for clarification to the printer 204, which may render the request in spoken form through a speaker, or within a user interface of the printer 204 or an associated device.

Other user preferences may be usefully stored at the print server 208 to facilitate autonomous, unsupervised fabrication of content from content sources 210. For example, a print server 208 may store a user's preference on handling objects greater than a build volume of a printer. These preferences may control whether to resize the object, whether to break the object into multiple sub-objects for fabrication, and whether to transmit multiple sub-objects to a single printer or multiple printers. In addition, user preferences or requirements may be stored, such as multi-color printing capability, build material options and capabilities, and so forth. More generally, a print queue (which may be a printer-specific or user-specific queue, and which may be hosted at a printer 204, a server 208, or some combination of these) may be managed by a print server 208 according to one or more criteria from a remote user requesting a print job. The print server 208 may also store user preferences or criteria for filtering content, e.g., for automatic printing or other handling. While this is described below as a feature for autonomous operation of a printer (such as a printer that locally subscribes to a syndicated model source), any criteria that can be used to identify models of potential interest by explicit type (e.g., labeled in model metadata), implicit type (e.g., determined based on analysis of the model), source, and so forth, may be provided to the print server 208 and used to automatically direct new content to one or more user-specified ones of the three-dimensional printers 204.

In one aspect, the processor of the print server may be configured to store a plurality of print jobs submitted to the web server in a log and to provide an analysis of print activity based on the log. This may include any type of analysis that might be useful to participants in the environment 200. For example, the analysis may include tracking of the popularity of particular objects, or of particular content sources. The analysis may include tracking of which three-dimensional printers 204 are most popular or least popular, or related statistics such as the average backlog of pending print jobs at a number of the three-dimensional printers 204. The analysis may include success of a particular printer in fabricating a particular model or of a particular printer in completing print jobs generally. More generally, any statistics or data may be obtained, and any analysis may be performed, that might be useful to users (e.g., when requesting prints), content sources (e.g., when choosing new printable objects for publication), providers of fabrication resources (e.g., when setting fees), or network facilitators such as the print servers 208.

A print server 208 may also maintain a database 209 of content, along with an interface for users at client devices 206 to search the database 209 and request fabrication of objects in the database 209 using any of the three-dimensional printers 204. Thus in one aspect, a print server 208 (or any system including the print server 208) may include a database 209 of three-dimensional models, and the print server 208 may act as a server that provides a search engine for locating a particular three-dimensional model in the database 209. The search engine may be a text-based search engine using keyword text queries, plain language queries, and so forth. The search engine may also or instead include an image-based search engine configured to identify three-dimensional models similar to a two-dimensional or three-dimensional image provide by a user.

In another aspect, the printer server 208 may periodically search for suitable content at remote locations on the data network, which content may be retrieved to the database 209, or have its remote location (e.g., a URL or other network location identifier) stored in the database 209. In another aspect, the print server 208 may provide an interface for submission of objects from remote users, along with any suitable metadata such as a title, tags, creator information, descriptive narrative, pictures, recommended printer settings, and so forth. In one aspect, the database 209 may be manually curated according to any desired standards. In another aspect, printable objects in the database 209 may be manually or automatically annotated according to content type, popularity, editorial commentary, and so forth.

The print server 208 may more generally provide a variety of management functions. For example, the print server 204 may store a location of a predetermined alternative three-dimensional printer to execute a print job from a remote user in the event of a failure by the one of the plurality of three-dimensional printers 204. In another aspect, the print server 208 may maintain exclusive control over at least one of the plurality of three-dimensional printers 204, such that other users and/or print servers cannot control the printer. In another aspect, the print server 208 may submit a print job to a first available one of the plurality of three-dimensional printers 204.

In another aspect, a print server 208 may provide an interface for managing subscriptions to sources of content. This may include tools for searching existing subscriptions, locating or specifying new sources, subscribing to sources of content, and so forth. In one aspect, a print server 208 may manage subscriptions and automatically direct new content from these subscriptions to a three-dimensional printer 204 according to any user-specified criteria. Thus while it is contemplated that a three-dimensional printer 204 may autonomously subscribe to sources of content through a network interface and receive new content directly from such sources, it is also contemplated that this feature may be maintained through a remote resource such as a print server 208.

A print server 208 may maintain print queues for participating three-dimensional printers 204. This approach may advantageously alleviate backlogs at individual printers 204, which may have limited memory capacity for pending print jobs. More generally, a print server 208 may, by communicating with multiple three-dimensional printers 204, obtain a view of utilization of multiple networked resources that permits a more efficient allocation of print jobs than would be possible through simple point-to-point communications among users and printers. Print queues may also be published by a print server 208 so that users can view pending queues for a variety of different three-dimensional printers 204 prior to selecting a resource for a print job. In one aspect, the print queue may be published as a number of print jobs and size of print jobs so that a requester can evaluate likely delays. In another aspect, the print queue may be published as an estimated time until a newly submitted print job can be initiated.

In one aspect, the print queue of one of the print servers 208 may include one or more print jobs for one of the plurality of three-dimensional printers 204. The print queue may be stored locally at the one of the plurality of three-dimensional printers. In another aspect, the print queue may be allocated between the database 209 and a local memory of the three-dimensional printer 204. In another aspect, the print queue may be stored, for example, in the database 209 of the print server 208. As used here, the term 'print queue' is intended to include print data (e.g., the three-dimensional model or tool instructions to fabricate an object) for a number of print job (which may be arranged for presentation in order of expected execution), as well as any metadata concerning print jobs. Thus, a portion of the print queue such as the metadata (e.g., size, status, time to completion) may be usefully communicated to a print server 208 for sharing among users while another portion of the print queue such as the model data may be stored at a printer in preparation for execution of a print job.

Print queues may implement various user preferences on prioritization. For example, for a commercial enterprise, longer print jobs may be deferred for after normal hours of operation (e.g., after 5:00 p.m.), while shorter print jobs may be executed first if they can be completed before the end of a business day. In this manner, objects can be identified and fabricated from within the print queue in a manner that permits as many objects as possible to be fabricated before a predetermined closing time. Similarly, commercial providers of fabrication services may charge explicitly for prioritized fabrication, and implement this prioritization by prioritizing print queues in a corresponding fashion.

In another aspect, a print server 208 may provide a virtual workspace for a user. In this virtual workspace, a user may search local or remote databases of printable objects, save objects of interest (or links thereto), manage pending prints, specify preferences for receiving status updates (e.g., by electronic mail or SMS text), manage subscriptions to content, search for new subscription sources, and so forth. In one aspect, the virtual workspace may be, or may include, web-based design tools or a web-based design interface that permits a user to create and modify models. In one aspect, the virtual workspace may be deployed on the web, while permitting direct fabrication of a model developed within that environment on a user-specified one of the three-dimensional printers 204, thus enabling a web-based design environment that is directly coupled to one or more fabrication resources.

The content sources 210 may include any sources of content for fabrication with a three-dimensional printer 204. This may, for example, include databases of objects accessible through a web interface or application programming interface. This may also or instead include individual desktop computers or the like configured as a server for hosted access, or configured to operate as a peer in a peer-to-peer network. This may also or instead include content subscription services, which may be made available in an unrestricted fashion, or may be made available on a paid subscription basis, or on an authenticated basis based upon some other relationship (e.g., purchase of a related product or a ticket to an event). It will be readily appreciated that any number of content providers may serve as content sources 210 as contemplated herein. By way of non-limiting example, the content sources 210 may include destinations such as amusement parks, museums, theaters, performance venues, or the like, any of which may provide content related to users who purchase tickets. The content sources 210 may include manufacturers such as automobile, computer, consumer electronics, or home appliance manufacturers, any of which may provide content related to upgrades, maintenance, repair, or other support of existing products that have been purchased. The content sources 210 may include artists or other creative enterprises that sell various works of interest. The content sources 210 may include engineering or architectural firms that provide marketing or advertising pieces to existing or prospective customers. The content sources 210 may include marketing or advertising firms that provide promotional items for clients. More generally, the content sources 210 may be any individual or enterprise that provides single or serial objects for fabrication by the three-dimensional printers 204 described herein.

One or more web servers 211 may provide web-based access to and from any of the other participants in the environment 200. While depicted as a separate network entity, it will be readily appreciated that a web server 211 may be logically or physically associated with one of the other devices described herein, and may, for example, provide a user interface for web access to one of the three-dimensional printers 204, one of the print servers 208 (or databases 209 coupled thereto), one of the content sources 210, or any of the other resources 216 described below in a manner that permits user interaction through the data network 202, e.g., from a client device 206 or mobile device 212.

The mobile devices 212 may be any form of mobile device, such as any wireless, battery-powered device, that might be used to interact with the networked printing environment 200. The mobile devices 212 may, for example, include laptop computers, tablets, thin client network computers, portable digital assistants, messaging devices, cellular phones, smart phones, portable media or entertainment devices, and so forth. In general, mobile devices 212 may be operated by users for a variety of user-oriented functions such as to locate printable objects, to submit objects for printing, to monitor a personally owned printer, and/or to monitor a pending print job. A mobile device 212 may include location awareness technology such as Global Positioning System ("GPS"), which may obtain information that can be usefully integrated into a printing operation in a variety of ways. For example, a user may select an object for printing and submit a model of the object to a print server, such as any of the print servers described above. The print server may determine a location of the mobile device 212 initiating the print job and locate a closest printer for fabrication of the object.

In another aspect, a printing function may be location-based, using the GPS input (or cellular network triangulation, proximity detection, or any other suitable location detection techniques). For example, a user may be authorized to print a model only when the user is near a location (e.g., within a geo-fenced area or otherwise proximal to a location), or only after a user has visited a location. Thus a user may be provided with printable content based upon locations that the user has visited, or while within a certain venue such as an amusement park, museum, theater, sports arena, hotel, or the like. Similarly, a matrix barcode such as a QR code may be employed for localization.

The other resources 216 may include any other software or hardware resources that may be usefully employed in networked printing applications as contemplated herein. For example, the other resources 216 may include payment processing servers or platforms used to authorize payment for content subscriptions, content purchases, or printing resources. As another example, the other resources 216 may include social networking platforms that may be used, e.g., to share three-dimensional models and/or fabrication results according to a user's social graph. In another aspect, the other resources 216 may include certificate servers or other security resources for third party verification of identity, encryption or decryption of three-dimensional models, and so forth. In another aspect, the other resources 216 may include online tools for three-dimensional design or modeling, as well as databases of objects, surface textures, build supplies, and so forth. In another aspect, the other resources 216 may include a desktop computer or the like co-located (e.g., on the same local area network with, or directly coupled to through a serial or USB cable) with one of the three-dimensional printers 204. In this case, the other resource 216 may provide supplemental functions for the three-dimensional printer 204 in a networked printing context such as maintaining a print queue or operating a web server for remote interaction with the three-dimensional printer 204. Other resources 216 also include supplemental resources such as three-dimensional scanners, cameras, and post-processing/finishing machines or resources. More generally, any resource that might be usefully integrated into a networked printing environment may be one of the resources 216 as contemplated herein.

It will be readily appreciated that the various components of the networked printing environment 200 described above may be arranged and configured to support networked printing in a variety of ways. For example, in one aspect there is disclosed herein a networked computer with a print server and a web interface to support networked three-dimensional printing. This device may include a print server, a database, and a web server as discussed above. The print server may be coupled through a data network to a plurality of three-dimensional printers and configured to receive status information from one or more sensors for each one of the plurality of three-dimensional printers. The print server may be further configured to manage a print queue for each one of the plurality of three-dimensional printers. The database may be coupled in a communicating relationship with the print server and configured to store print queue data and status information for each one of the plurality of three-dimensional printers. The web server may be configured to provide a user interface over the data network to a remote user, the user interface adapted to present the status information and the print queue data for one or more of the plurality of three-dimensional printers to the user and the user interface adapted to receive a print job from the remote user for one of the plurality of three-dimensional printers.

The three-dimensional printer 204 described above may be configured to autonomously subscribe to syndicated content sources and periodically receive and print objects from those sources. Thus in one aspect there is disclosed herein a device including any of the three-dimensional printers described above; a network interface; and a processor (which may without limitation include the controller for the printer). The processor may be configured to subscribe to a plurality of sources of content (such as the content sources 210 described above) selected by a user for fabrication by the three-dimensional printer through the network interface. The processor may be further configured to receive one or more three-dimensional models from the plurality of content sources 210 and to select one of the one or more three-dimensional models for fabrication by the three-dimensional printer 204 according to a user preference for prioritization. The user preference may, for example, preferentially prioritize particular content sources 210, or particular types of content (e.g., tools, games, artwork, upgrade parts, or content related to a particular interest of the user).

The memory of a three-dimensional printer 204 may be configured to store a queue of one or more additional three-dimensional models not selected for immediate fabrication. The processor may be programmed to periodically re-order or otherwise alter the queue according to predetermined criteria or manual user input. For example, the processor may be configured to evaluate a new three-dimensional model based upon a user preference for prioritization, and to place the new three-dimensional model at a corresponding position in the queue. The processor may also or instead be configured to retrieve content from one of the content sources 210 by providing authorization credentials for the user, which may be stored at the three-dimensional printer or otherwise accessible for presentation to the content source 210. The processor may be configured to retrieve content from at least one of the plurality of content sources 210 by authorizing a payment from the user to a content provider. The processor may be configured to search a second group of sources of content (such as any of the content sources 210 described above) according to one or more search criteria provide by a user. This may also or instead include demographic information for the user, contextual information for the user, or any other implicit or explicit user information.

In another aspect, there is disclosed herein a system for managing subscriptions to three-dimensional content sources such as any of the content sources 210 described above. The system may include a web server configured to provide a user interface over a data network, which user interface is adapted to receive user preferences from a user including a subscription to a plurality of sources of a plurality of three-dimensional models, a prioritization of content from the plurality of sources, and an identification of one or more fabrication resources coupled to the data network and suitable for fabricating objects from the plurality of three-dimensional models. The system may also include a database to store the user preferences, and to receive and store the plurality of three-dimensional models as they are issued by the plurality of sources. The system may include a processor (e.g., of a print server 208, or alternatively of a client device 206 interacting with the print server 208) configured to select one of the plurality of three-dimensional models for fabrication based upon the prioritization. The system may include a print server configured to communicate with the one or more fabrication resources through the data network, to determine an availability of the one or more fabrication resources, and to transmit the selected one of the plurality of three-dimensional models to one of the one or more fabrication resources.

In another aspect, there is disclosed herein a network of three-dimensional printing resources comprising a plurality of three-dimensional printers, each one of the plurality of three-dimensional printers including a network interface; a server configured to manage execution of a plurality of print jobs by the plurality of three-dimensional printers; and a data network that couples the server and the plurality of three-dimensional printers in a communicating relationship.

In general as described above, the server may include a web-based user interface configured for a user to submit a new print job to the server and to monitor progress of the new print job. The web-based user interface may permit video monitoring of each one of the plurality of three-dimensional printers, or otherwise provide information useful to a remote user including image-based, simulation-based, textual-based or other information concerning status of a current print. The web-based user interface may include voice input and/or output for network-based voice control of a printer.

The fabrication resources may, for example, include any of the three-dimensional printers 204 described above. One or more of the fabrication resources may be a private fabrication resource secured with a credential-based access system. The user may provide, as a user preference and prior to use of the private fabrication resource, credentials for accessing the private fabrication resource. In another aspect, the one or more fabrication resources may include a commercial fabrication resource. In this case the user may provide an authorization to pay for use of the commercial fabrication resource in the form of a user preference prior to use of the commercial fabrication resource.

Many current three-dimensional printers require significant manufacturing time to fabricate an object. At the same time, certain printers may include a tool or system to enable multiple, sequential object prints without human supervision or intervention, such as a conveyor belt. In this context, prioritizing content may be particularly important to prevent crowding out of limited fabrication resources with low priority content that arrives periodically for autonomous fabrication. As a significant advantage, the systems and methods described herein permit prioritization using a variety of user-specified criteria, and permit use of multiple fabrication resources in appropriate circumstances. Thus prioritizing content as contemplated herein may include any useful form of prioritization. For example, this may include prioritizing the content according to source. The content sources 210 may have an explicit type that specifies the nature of the source (e.g., commercial or paid content, promotional content, product support content, non-commercial) or the type of content provided (e.g., automotive, consumer electronics, radio control hobbyist, contest prizes, and so forth). Prioritizing content may include prioritizing the content according to this type. The three-dimensional models themselves may also or instead include a type (e.g., tool, game, home, art, jewelry, replacement part, upgrade part, etc.) or any other metadata, and prioritizing the content may include prioritizing the content according to this type and/or metadata.

In one aspect, the processor may be configured to select two or more of the plurality of three-dimensional models for concurrent fabrication by two or more of the plurality of fabrication resources based upon the prioritization when a priority of the two or more of the plurality of three-dimensional models exceeds a predetermined threshold. That is, where particular models individually have a priority above the predetermined threshold, multiple fabrication resources may be located and employed to fabricate these models concurrently. The predetermined threshold may be evaluated for each model individually, or for all of the models collectively such as on an aggregate or average basis.

In one aspect, the processor may be configured to adjust prioritization based upon a history of fabrication when a number of objects fabricated from one of the plurality of sources exceeds a predetermined threshold. Thus, for example, a user may limit the number of objects fabricated from a particular source, giving subsequent priority to content from other sources regardless of an objectively determined priority for a new object from the particular source. This prevents a single source from overwhelming a single fabrication resource, such as a personal three-dimensional printer operated by the user, in a manner that crowds out other content from other sources of possible interest. At the same time, this may enable content sources 210 to publish on any convenient schedule, without regard to whether and how subscribers will be able to fabricate objects.

In another aspect, the processor may be configured to identify one or more additional sources of content based upon a similarity to one of the plurality of sources of content. For example, where a content source 210 is an automotive manufacturer, the processor may perform a search for other automotive manufactures, related parts suppliers, mechanics, and so forth. The processor may also or instead be configured to identify one or more additional sources of content based upon a social graph of the user. This may, for example, include analyzing a social graph of relationships from the user to identify groups with common interests, shared professions, a shared history of schools or places of employment, or a common current or previous residence location, any of which may be used to locate other sources of content that may be of interest to the user.

Figure 3A:
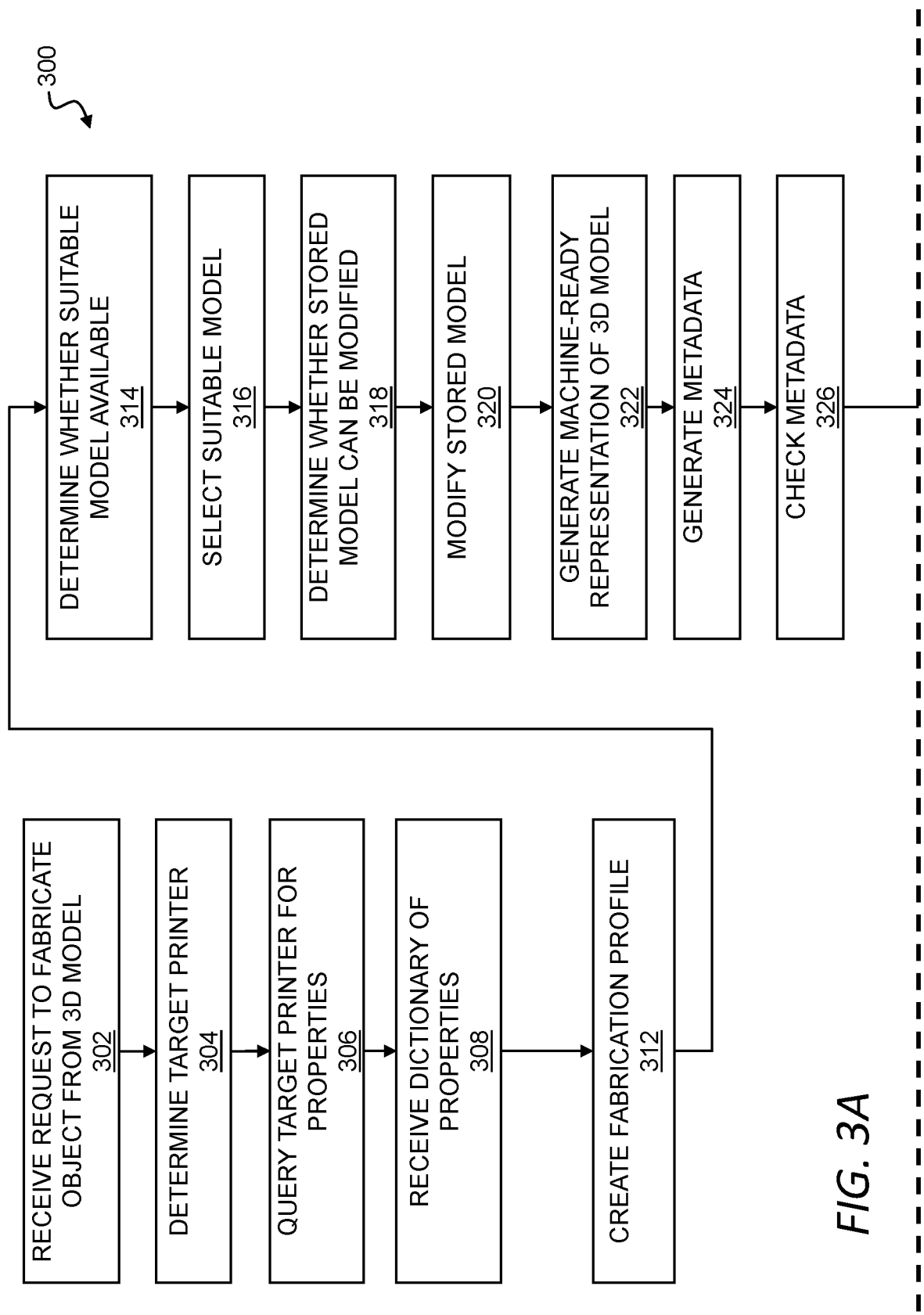
FIGS. 3A-3B show a flowchart of a method for providing machine-ready models based on printer configuration.
Figure 3B:
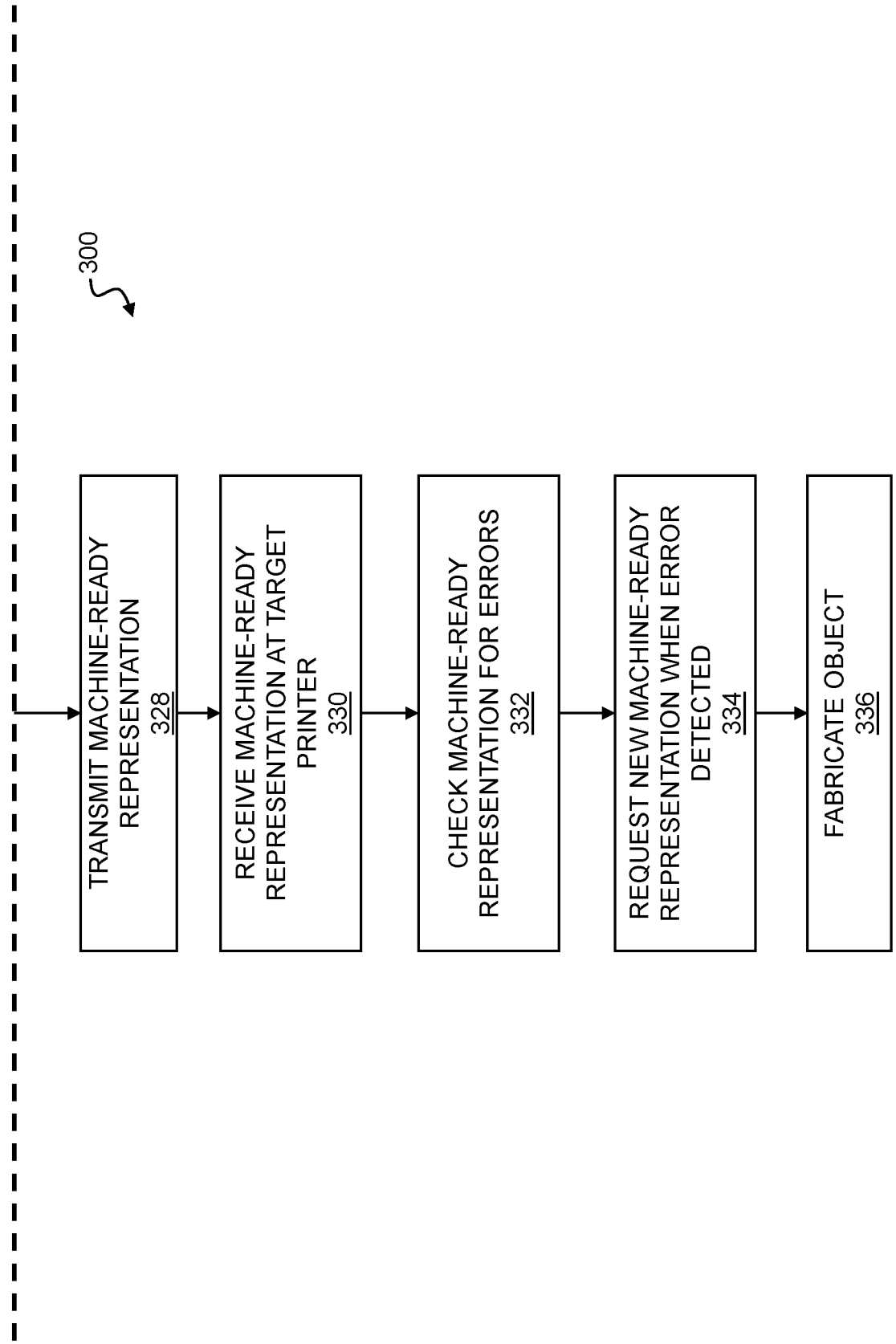

FIGS. 3A-3B show a flowchart of a method for providing machine-ready models based on printer configuration. Specifically, FIG. 3B is a continuation of the method 300 shown in FIG. 3A. In general, machine-ready models may take into account a printer's properties and configuration in order to plan toolpaths. Whereas slicers that create on-demand models, or services that look up and provide pre-sliced, machine-ready models may not have knowledge of a printer's properties, the method 300 of FIGS. 3A-3B includes a technique for providing suitable machine-ready models taking into account a printer's configuration. The method 300 of FIGS. 3A-3B may be used for any of the printers as described herein, e.g., three-dimensional printers, or for other devices and systems. For example, an endpoint in the method 300 may be a printer or another endpoint, e.g., an endpoint that utilizes a model in its operation, where the model can be created or chosen based on the endpoint's configuration or properties.

There are numerous makes and models of printers, each of which may have different physical capabilities such as build volume, extruder types, minimum step sizes, top speeds, operating temperature ranges, and so forth. Similarly, there may be user configurations, user preferences and the like that are defined in software, as well as hardware accessories such as cameras, three-dimensional scanners, heated build platforms, conveyors, and so forth. Additionally, these printer configurations may change over time, either resulting from manufacturer updates to improve printer performance or user modifications for convenience, specialty applications, and so forth. Against this backdrop, the methods and systems described herein provide useful techniques for determining printer capabilities and matching these capabilities to pre-existing machine-ready models.

As shown in step 302, the method 300 may include receiving a request to fabricate an object from a three-dimensional model. This request may come from any of a variety of automated or manually controlled sources, and may be directed to any of a variety of resources including a local printer, a remote print server, and so forth. Receiving the request to fabricate the object may for example include receiving the request at a remote print server, receiving the request at the target printer, receiving the request at a computer locally connected to the target printer, receiving the request at another location, or any combination thereof. Receiving the request to fabricate the object from the three-dimensional model may also or instead include receiving the request from the target printer. The request may also or instead be received from a user, e.g., through a remote device or local device that interacts with at least one of the print server, the target printer, or another resource, e.g., through a network. The request may also be received from another requester or from multiple requesters.

The object may include any object that can be fabricated or manufactured by the printers as described herein, e.g., an object fabricated in three dimensions by depositing successive layers of material in two-dimensional patterns.

The three-dimensional model may include a computer model or other computerized representation of the object such as an STL file containing a polygonal mesh or the like characterizing an object in three dimensions. The three-dimensional model may also or instead include data derived from a scan of the object such as a point cloud or the like. The three-dimensional model may also or instead include any other three-dimensional surface or volumetric representation of the object, or any combination of the foregoing that is useful for describing a three-dimensional form of an object. The three-dimensional model may include a three-dimensional design created by a user, e.g., using local or online tools for three-dimensional design and modeling. The three-dimensional model may be located on the target printer, at a computer locally connected to the target printer (or remotely connected to the target printer or other component through a network), at the print server, on a database or other resource connected to any of the foregoing (e.g., a service or webpage that provides three-dimensional models for fabricating objects corresponding to same), and the like. In general, the three-dimensional model may be any suitable digital representation of a three-dimensional shape, such as a computer-automated design (CAD) model, a stereolithography (STL) file, a 3DS file, a DEM file, a COLLADA file, or any other such file. The three-dimensional model may be used as the basis for a machine-ready representation corresponding thereto, where the machine-ready representation contains instructions that can be directly executed on the target printer for fabrication of the object. To this end, the machine-ready representation may be configured for use on the target printer based on the properties of the target printer.

As shown in step 304, the method 300 may include determining a target printer to fabricate the object. Determining the target printer may include identifying a selected printer in the request. The selected printer may have been manually selected by a user, e.g., the requester. It will be understood that any selection or input provided by a user discussed herein may be done through a graphical user interface (GUI) included as part of the systems described herein, e.g., a GUI on the target printer, a GUI on a computer connected to the target printer, a GUI on a mobile device, and so on. Determining the target printer may also or instead include selecting the target printer at a remote print server based on one or more selection criteria. The selection criteria may include any criteria that provides for selection of the target printer, e.g., a logical, logistically convenient, or practical selection of the target printer. The selection criteria may include information related to the three-dimensional model (or an aspect thereof, e.g., metadata included therein), the object to be fabricated (e.g., the size, shape, color, material, and so forth), a print queue, a prioritization, a location of the printer or requester, a timeline, printer attributes (e.g., capabilities, properties, features, functions, and the like), and so forth. The target printer may be any of the printers as described herein, or another endpoint, component, machine, or resource. In one aspect, the target printer may include more than one printer.

As shown in step 306, the method 300 may include querying the target printer for one or more properties relevant to fabrication of the object. The query may be initiated by the requester, the print server, or another resource in a system utilizing the method 300. The query may request specific properties of the target printer, or the query may be a general query for properties or information relevant to fabrication of an object on the target printer. In one aspect, numerous queries are sent to numerous printers, e.g., for use in selecting one or more of the printers as the target printer. In another aspect, the query is sent to a printer that is not necessarily the target printer as described herein, e.g., when the query or information received from a response to the query is used for the selection of the target printer.

The properties may include one or more of information, capabilities, features, functions, configurations, data, and the like relevant to fabrication of the object. It will be understood that throughout this disclosure the terms 'property' and 'configuration' (and variations thereof) may be used interchangeably, and thus, unless explicitly stated otherwise or clear from the context, a property may include a configuration and vice-versa. The properties may include a hardware configuration of the target printer, a software configuration, a user setting or preference, or a firmware configuration of the target printer.

The hardware configuration may include, without limitation, one or more of a printer type (e.g., printer brand or general type of fabrication machine), a printer model, a printer version or generation, an extruder type, an extruder nozzle diameter, a build volume (e.g., build volume size, build volume shape, and so forth), a build platform type, a build platform size, a processor type, a memory capacity, an identification number (e.g., a hardware version number or model number), a speed (e.g., top speed) for linear movement of a tool (e.g., a tool for three-dimensional fabrication of an object), a step size for movement of the tool, a z-axis step size (e.g., a minimum z-axis step size), tool path limitations, a gantry type or configuration (e.g., including gantry limitations and capabilities), a build material type or other properties of the build material (e.g., filament properties), operating temperature ranges, and so forth. The hardware configuration may also include minimum and maximum travel speeds, shell speeds, deposition speeds, fill speeds, acceleration settings (e.g., jerk information such as jerk limits, acceleration rates, and the like), and so forth.

The hardware configuration may include an automatically detected hardware reconfiguration or a manually specified hardware reconfiguration. For example, if a user has provided a new or replacement component on their printer, the user can manually update the hardware configuration associated with the printer to reflect the new component, e.g., through a GUI or the like. Alternatively, the printer (or another component of the system, e.g., the print server) can automatically detect that a new component is being utilized, and update the hardware configuration accordingly. In this manner, the hardware configuration may be continuously monitored and updated. When a hardware reconfiguration occurs to the printer, the printer (or another component of the system, e.g., the print server) can send a notification or the like to users, e.g., users that are connected to the printer through a network. The notification may include a notice of the new component, and may include an action that the user must perform to request or receive the hardware reconfiguration. If users are not connected to other components of the system, they may receive the hardware reconfiguration when they connect to the system components through a network or the like.

The hardware configuration may be determined or detected automatically by a component or sensor of the printer. The hardware configuration may also or instead be determined through movement or sensing provided by a component of the printer. For example, an extruder or tool head on a printer may sense its configuration or the configuration of another component of the printer such as the build platform or gantry. A component of the printer may also or instead include circuitry that identifies components used in a printer or their configuration thereof. The circuitry may utilize radio frequency identification tags or the like associated with components or configurations of the printer. The printer or a printing system may also or instead include a tool crib or the like, where a sensor system determines which tools are utilized by the printer at a given time. Determination of the hardware configuration may utilize any of the devices, systems, and techniques described in U.S. patent application Ser. No. 14/081,922 filed on Nov. 15, 2013, the entire content of which is hereby incorporated by reference.

The software configuration of the target printer may include programming or applications related to the printer, the print server, the user (e.g., a mobile device of the user, or a computer of the user), another resource, or any combination thereof. The software configuration of the target printer may include a version of a slicer used by the target printer, or a version of a slicer that typically creates machine-ready representations of three-dimensional models for the target printer. The software configuration may also or instead include slicer settings, e.g., plate variability and the like. The software configuration of the target printer may include the operating system used by the target printer. The software configuration of the target printer may also or instead include the communications software used by the target printer. In a similar manner as discussed above for the hardware configuration, the software configuration may include an automatically detected software reconfiguration or a manually specified software reconfiguration.

The firmware configuration of the target printer may include the firmware version or other aspects and data related to the firmware utilized by the target printer or an associated computing device. In one aspect, the printer firmware has information related to the hardware and software configuration of the printer. For example, the hardware and software configurations may be stored in firmware (e.g., the printer firmware can know its hardware configuration), or error checking the configuration of the printer may occur in firmware. In a similar manner as discussed above for the hardware configuration, the firmware configuration may include an automatically detected firmware reconfiguration or a manually specified firmware reconfiguration. For example, the firmware configuration of the target printer may be updated when the firmware of the target printer is updated.

As discussed above, the properties may also or instead include printing capabilities of the target printer. The printing capabilities may include without limitation color capabilities (e.g., one color, multi-color, color mixing, color changing, and the like), size capabilities (e.g., overall size or minimum feature size), speed capabilities, resolution and accuracy capabilities, build material capabilities, and so forth.

The properties may also or instead include one or more user settings on the target printer. The user settings may include settings that were updated, or settings that were used for a previous fabrication process. The user settings may be inputted directly on the printer, e.g., through manual configuration of the printer or its components, or by using a GUI or the like on the printer or a device in communication with the printer. The user settings may include settings related to the hardware configuration, or settings that otherwise influence the fabrication of the object. For example, the user settings may include without limitation color settings, resolution settings, speed settings, size settings, location settings, material settings, and so forth. In one aspect, the user settings may automatically be detected by the printer or print server. For example, material settings such as type of material may be detected through the use of a labeled material source (a labeled spool or the like), through a code on the material, via a sensor on the printer, and so forth.

The properties may also include an application used to operate the target printer. The application may execute on the printer or a device in communication with the printer, e.g., a computer or mobile device of the user. The properties may further include a build material in the target printer.

As shown in step 308, the method 300 may include receiving a dictionary of the one or more properties from the target printer. The dictionary may thus include properties of a printer, e.g., the target printer. The properties included in the dictionary may include any as described herein or otherwise known in the art. The dictionary may be a list or collection of the properties, or may be otherwise configured to organize the properties of the printer, e.g., for readability and use by a print server, slicing engine, user, other resource, or the like. The information included in the dictionary may be relevant to slicing a three-dimensional model to create a machine-ready representation for the printer. The dictionary may include information or rules related to the properties. The dictionary may define the hardware, software, firmware, printing capabilities, printing rules, and so forth, for the printer. The dictionary may include encrypted, protected, or hashed data. One skilled in the art will recognize that there are numerous ways to create and code such a dictionary as described herein. Some examples of the manner of information and data that may be included in the dictionary are included below.

The dictionary may include one or more identifiers for the target printer. For example, the target printer may include an identification number or code, where this identification number or code is the dictionary itself, i.e., the identification number or code acts as an implicit dictionary by uniquely specifying a particular printer or printer type. The identification number or code may include a configuration version, e.g., the identification number or code may be associated with a particular configuration including any information pertinent to generating or choosing a proper machine-ready representation. The dictionary may also or instead include other information in addition to or in lieu of such an identifier. The identifier may include a hash that may be used in conjunction with a hash table. The identifier for the printer may be a unique identifier, i.e., an identifier specific to that particular printer. In this manner, if a printer is manufactured or built to a customer's specifications (i.e., it is customized), information pertaining to the printer may be acquired or known through its unique identifier. Thus, a component configured to interpret the dictionary (e.g., the print server) may retrieve and analyze the properties of the printer simply through its identifier included in the dictionary. The identifiers for the target printer may also or instead include brand information, model information, generation information, version information, and the like. For example, the identifier may include a model number, which can be the same for each printer associated with that particular model number. Properties may be known for the model number (e.g., properties for particular model numbers may be stored in a database), and the component configured to interpret the dictionary (e.g., the print server) may retrieve and analyze the properties of the printer through the model number included in the dictionary. For example, the model number may have associated default configurations that are known, e.g., by a three-dimensional printing application provider or a service for providing of machine-ready models. In this manner, when a particular printer is connected to the print server, the print server may use a default machine-ready model profile (or slicer profile) for that particular model number of printer. This default profile may be used as a starting template for customized printers of a particular model. Also, users may be able to log updates to their particular printer model's configuration.

The dictionary may also include one or more flags or the like. The flags may include a linear array of binary indicators of whether a printer includes a certain property or not, or whether the printer has a certain printing capability or not. More generally, the flags may include any tags, labels, colors, descriptors, and the like useful for specifying printer properties. Still more generally, the flags may include any suitable means for storing information in a dictionary in a manner that can be decoded and used to determine printer properties.

The dictionary may include codes for the properties of a printer. The codes may include a numeric form, which may include numeric information pertaining to the properties. For example, the build volume may be provided by the explicit numbers related to the size of the build volume (e.g., the actual length, width, and height, for example in the x, y, and z directions), and the nozzle diameter may be provided by its explicit diameter. The code may also or instead be interpreted or decrypted, where the component configured to interpret the dictionary may utilize a database for looking up the meaning of the code.

In general, the dictionary may be provided in any suitable format. The dictionary may for example be formed as a vector of binary flags or other attributes that form a description of properties included therein. The dictionary may also, where appropriate, include scalar quantities for certain properties.

One skilled in the art will recognize that the dictionary may include properties of a printer, and information pertaining to the properties of the printer, at any desired level of granularity according to, e.g., the data storage and processing capabilities of the components being used in a system implementing the method 300. In general, the dictionary may include any information pertinent to generating or choosing a machine-ready representation of a three-dimensional model of an object for a printer in fabricating that object. This information may be provided automatically by a printer or print server, or inputted manually by a user, e.g., using a GUI or the like where a user can enter or select properties pertaining to their printer.

As described above, the dictionary may include properties of the build material. The properties of the build material may include without limitation build material type (e.g., filament, pellets, or otherwise), build material composition (e.g., PLA, ABS, and so on), build material size (e.g., filament width), deposition and retraction settings for the build material (e.g., deposition or ooze volume, hop distance, retraction distance, and so on), flow rate data (e.g., minimum and maximum flow rate), atomic properties, chemical properties, electrical properties, environmental properties, magnetic properties, manufacturing properties, mechanical properties, optical properties, thermal properties, and so forth. The properties of the build material may also or instead include properties on one or more materials derived from known properties of the materials, which may be derived from the material composition, a model or manufacturer number, and so forth.

The dictionary may include user settings as described herein, or the dictionary may be separate from the user settings. In one aspect, the fabrication profile as described herein includes a combination of the dictionary and user settings.

According to the foregoing, receiving the dictionary of properties may in one aspect include receiving an identifier from the target printer and using the identifier to retrieve the dictionary from a repository of printer information remote from the target printer. The identifier may be any of the types discussed herein, e.g., model number, configuration version, and so forth. The identifier may also or instead identify or be associated with a particular dictionary or set of dictionaries. The repository may include a database, which may be local or remote from the target printer. For example, the repository may include a remote database on a print server, or a database remote to the print server, e.g., a database stored on an external resource in communication with the print server. The repository may include a plurality of dictionaries, where each is associated with an identifier, such as a particular model number of a printer. In this manner, once the identifier is received, the dictionary may be retrieved and the properties or configuration of a printer may become known to the system. In this manner, a target printer may change its status from unknown to known, i.e., in terms of its configuration.

As shown in step 312, the method 300 may include creating a fabrication profile based on the one or more properties. The fabrication profile may be created by the target printer, a print server, an external resource, or another component of a system implementing the method 300. The fabrication profile may be the basis for the generation of a machine-ready representation of the three-dimensional model that is executable on the target printer, and thus the fabrication profile may include information for generating machine-ready representations for the target printer. The fabrication profile may be generated from information included in the dictionary, e.g., properties of the target printer. For example, in an aspect, the dictionary includes information on a tool head such as an extruder, e.g., the nozzle diameter of the extruder. The nozzle diameter may thus be one aspect that is used to translate the three-dimensional model into the machine-ready representation. In one aspect, the fabrication profile includes the dictionary. The fabrication profile may also or instead be a profile used to determine which machine-ready representation is available or suitable for a target printer. The fabrication profile may be specific to each printer, or may be used for a plurality of printers, e.g., printers of the same type, model, version, and so forth. The fabrication profile may be saved in the repository such as a database, which may be remote or local to the target printer, e.g., on a remote print server or an external resource. The fabrication profile may include machine readable information for the slicer in creating a machine-ready model. The fabrication profile may be created using a library or the like and a resource or tool that parses the fabrication profile and obtains suitable inputs for a slicing engine or other program used to create machine-ready models. Thus the resource or tool may translate or interpret the dictionary into information for the slicer so that a suitable model can be created (or selected) for the target printer.

The fabrication profile may be created based on mathematical parameters. In one aspect, information obtained from the dictionary is the same as the information in the fabrication profile (e.g., numerical values associated with physical dimensions such as a nozzle width, build volume, and the like). In another aspect, information obtained from the dictionary may be different from the information in the fabrication profile. For example, a top speed may be included in the dictionary of properties, but tool instructions in the fabrication profile for top speed may be different based on a particular portion of the object to be formed (e.g., whether the particular tool instructions are for the raft, the shell, or the infill of the object to be formed), where the information is populated based on the top speed. In other situations, certain hardware properties or configurations may be combined to create the fabrication profile. For example, slicing parameters may be based on a binary decision (e.g., if the printer includes an automatically leveled build platform, if there is a raft, if another printer is to be used, and so forth). Also, a portion of the object to be formed may have different instructions based on the material used, e.g., the raft properties may be dependent on material.

As shown in step 314, the method 300 may include determining whether a suitable machine-ready model is available for the fabrication profile. The machine-ready model, which may be otherwise referred to herein as a machine-ready representation, may be a machine-ready model of the three dimensional model of the object that is executable by a target printer to fabricate the object. The machine-ready model may be specific to certain properties of the printer. For example, the suitability of the machine-ready model may depend on one or more of the hardware configuration of the printer, the software configuration of the printer, and the firmware configuration of the printer. Thus, the determination of whether a suitable machine-ready model is available for the fabrication profile may include an analysis of one or more of the dictionary, the fabrication profile, the hardware configuration of the printer, the compatibility of the machine-ready model with the hardware configuration of the printer, the software configuration of the printer, the compatibility of the machine-ready model with the software configuration of the printer, the firmware configuration of the printer, the compatibility of the machine-ready model with the firmware configuration of the printer, and so forth. The suitable machine-ready model may be stored in a database of potentially suitable machine-ready models, e.g., a remote database on a print server or remote resource. The analysis may include a compatibility analysis, where each machine-ready model is analyzed for its compatibility with the fabrication profile.

As shown in step 316, the method 300 may include selecting the suitable machine-ready model if available and generating the machine-ready representation according to the fabrication profile if not available. In one aspect, if step 314 determines that a suitable machine-ready model is available for the fabrication profile, that machine-ready model may be selected in step 316. If it is determined in step 314 that a suitable machine-ready model is not available for the fabrication profile, step 316 may include generating the machine-ready representation according to the fabrication profile. The machine-ready representation may be generated using a slicing program or the like (otherwise referred to herein as a slicer) that creates tool instructions for the target printer for fabricating the object from a three-dimensional model. The slicer may be disposed on the printer, a mobile device, a computer connected to the printer or another component, the print server, a cloud, an external resource, or the like. The newly generated machine-ready representation may be stored with other machine-ready models, e.g., cached in a local or remote database. The newly generated machine-ready representation may also or instead be transmitted to a user, the printer, the print server, or elsewhere in a system implementing the method 300. The machine-ready representation may include machine-ready instructions for fabricating the object on the printer. The machine-ready representation may be generated using various techniques, e.g., any of the techniques described in U.S. Pat. Pub. No. 2014/0371895, the entire content of which is hereby incorporated by reference.

As shown in step 318, the method 300 may include determining whether one of the plurality of stored machine-ready models can be modified to satisfy the constraints of the fabrication profile. In one aspect, the print server or another component of the system may search for a machine-ready model that most closely meets the fabrication profile. The machine-ready model that most closely meets the fabrication profile will then be selected for modification to meet the fabrication profile or otherwise become suitable for use on the target printer. Before the machine-ready model is modified, a copy may be made, such that the unmodified version will remain in the plurality of stored machine-ready models.

As shown in step 320, the method 300 may include modifying one of the plurality of stored machine-ready models for use as the machine-ready representation if possible. Modifying one of the plurality of stored machine ready models may include, without limitation, one or more of translating the machine-ready representation, rotating the machine-ready representation, scaling the machine-ready representation, changing a top speed in a tool path for the target printer, and so forth. In a machine-ready representation such as g-code, this may include a simple search and substitution of suitable instruction steps. For example, any speed that exceeds a top speed may be located and replaced with the permitted top speed. For a scaling operation, any physical movement may be located and the numerical value may be adjusted according to a desired scale. In this manner, a machine-ready model may be provided without creating a new model from scratch—a very time and computationally expensive operation. The modification may be performed by a slicer or another tool of a system implementing the method 300. The modified machine-ready model may be stored with the other machine-ready models, e.g., in a local or remote database. The modified machine-ready representation may also or instead be transmitted to a user, the printer, the print server, or elsewhere in a system implementing the method 300.

As shown in step 322, the method 300 may include generating a new machine-ready representation according to the fabrication profile for use as the machine-ready representation, e.g., if modifying one of the stored machine-ready models is not possible.

As discussed herein, the method 300 may generally include generating a machine-ready representation of the three-dimensional model executable by the target printer to fabricate the object. Generating the machine-ready representation may include processing the three-dimensional model according to the fabrication profile. Processing the three-dimensional model may include slicing the three-dimensional model. Slicing the three-dimensional model may include decomposing the three-dimensional model into a sequence of two-dimensional slices. The inputs to this process may specify a variety of characteristics such as layer thickness, infilling density, tool temperature, tool speeds, and so forth. Slicing may be provided by a slicing engine or other software module, which may be on a printer, on a computer locally coupled to the printer, on a remote resource, or any combination of these. Processing the three-dimensional model may include generating g-code, which is commonly used for three-dimensional printers, or any other suitable printer-executable description of the object based upon the three-dimensional model. Processing the three-dimensional model may take place on the printer, a remote print server, a computer connected to the target printer, a computer remote to the target printer, in a cloud, by a service for providing machine-ready models, and the like. Generating the machine-ready representation may include creating toolpaths for a tool of the target printer. Generating the machine-ready representation may also or instead include selecting one of a plurality of stored machine-ready models according to the fabrication profile as the machine-ready representation. The machine-ready representations may be selected from, e.g., a database, a store (e.g., a digital or online store), a print service, and so forth. Generating the machine-ready representation may further include generating printer-executable instructions at a computer locally connected to the target printer.

As shown in step 324, the method 300 may include generating descriptive metadata to accompany the machine-ready representation. The descriptive metadata may specify one or more properties for comparison to properties of printers selected for fabricating the model or for potential printers to be analyzed for selection. The metadata may thus include information regarding how a machine-ready representation was created, or will be created, where the metadata may be checked against the properties of a printer.

The metadata may also or instead include printer properties, e.g., recommended printer settings. The metadata may also or instead include any descriptive information for the object, the digital three-dimensional model, the machine-ready representation pertaining to the three-dimensional model, and so forth. For example, the metadata may include information provided by a source of the three-dimensional model such as a title, author, creation date, propriety rights management information, descriptive text, and so forth. Where the three-dimensional model source is an automated model source such as a three-dimensional scanner, the metadata may also or instead identify a scanner time, time and date of a scan, scanning parameters (where applicable), scanner location, and so forth. Metadata may also or instead be provided from other sources. For example, a print server (or some other remote resource) may track downloads and prints of an object, and may log this information in the metadata as usage statistics covering, e.g., number of downloads, popularity, build results, and so forth. The metadata may thus include descriptive data from any of a variety of sources such as a computer rendering of an object, a photograph of an object, an author comment for an object, a number of downloads for an object (or a specific machine-ready model of the object), a category tag for an object, a popularity rating for an object, title, type, prioritization, other tags, creator information, descriptive narrative, pictures, and so forth.

As shown in step 326, the method 300 may include checking the descriptive metadata against a selected printer prior to fabrication by the selected printer. This may be particularly useful where the metadata includes recommended printer properties, i.e., where the recommended printer properties can be compared to the actual printer properties of the selected printer. The printer may be selected based on certain recommended printer properties in the metadata matching the actual printer properties, a certain percentage of matching properties, or the like. In a similar manner, a printer may not be selected if certain recommended printer properties in the metadata do not match the actual printer properties. The checking of the metadata may be performed by the printer, print server, an external resource, a user, and so forth.

As shown in step 328, the method 300 may include transmitting the machine-ready representation to the target printer for fabrication. The machine-ready representation may be transmitted by a print server, a computer connected to the target printer, a computer remote to the target printer, a remote resource, and the like. The transmission may include an e-mail containing the machine ready representation as an attachment, a download link to a location where the file can be retrieved, a direct file transfer (via FTP, SFTP, or the like), and so forth.

As shown in step 330, the method 300 may include receiving the machine-ready representation at the target printer. Alternatively, the machine-ready representation may be received by a print server, a computer connected to the target printer, a computer remote to the target printer, a remote resource, and the like. Receiving the machine-ready representation may include downloading the machine-ready representation, e.g., through a network, USB flash drive, or the like. It will also be understood that the machine-ready representation may be transmitted to the printer in its entirety or streamed in smaller segments where, e.g., memory capacity of the printer is limited and/or connectivity to the printer is of high quality and bandwidth.

As shown in step 332, the method 300 may include checking the machine-ready representation for errors. In one aspect, errors refer to mismatches between the instructions contained in the machine-ready representation and capabilities of the target printer such as movements at a speed greater than the top speed of the printer, or movements outside of the build volume of the printer. Thus, while any error checking may be performed according to, e.g, design or fabrication rules, known material properties etc., additional error checking is enabled by the current system where more specific information about printing capabilities can be obtained from the dictionary, fabrication profile, and explicit hardware and software properties. As noted above, this type of error checking can be further facilitated by metadata for the machine-ready representation that explicitly specifies, e.g., hardware requirements, assumptions about machine capabilities, and so forth.

Errors may include an incorrect configuration of either or both of the printer and the machine-ready representation. The printer, a print server, a computer connected to the target printer, a computer remote to the target printer, a remote resource, or the like, may check the machine-ready representation for errors. Settings, properties, or configurations of the printer may also or instead be checked for errors. In one aspect, an error check includes checking information included in the machine-ready representation, e.g., its metadata, and comparing this information to the printer's configuration. A user may receive a notification (e.g., an error message) when the machine-ready representation or the printer's configuration has errors. In another aspect, a new machine-ready representation may be obtained when the machine-ready representation or the printer's configuration has errors.

As shown in step 334, the method 300 may include requesting a new machine-ready representation when an error is detected. The new machine-ready representation may be requested by the printer, a print server, a computer connected to the target printer, a computer remote to the target printer, a remote resource, or the like. Alternatively, the machine-ready representation may be modified or there may be a request for modification when an error is detected.

As shown in step 336, the method 300 may include fabricating the object with the target printer, where the fabrication of the object is based on the machine-ready representation.

In another aspect, the method 300 outlined above may also or instead include managing a print queue. For example, a print server or client device may select a printer, receive a dictionary associated with that printer, and then create or select a machine-ready representation based on the selected printer's configuration. If the selected printer malfunctions, the print server or another component of the system may receive information regarding the malfunction, query one or more other printers, and select another printer based on its configuration or other relevant parameters. The print server or another component of the system may then receive a dictionary from the subsequently selected printer and then create or select another machine-ready representation or use the same machine-ready representation already created or selected. Alternatively, the system can create or select a plurality of machine-ready representations for one or more printers initially, or select a similar printer with a similar dictionary, such that the same or similar machine-ready representations can be utilized for one or more printers.

Figure 4:
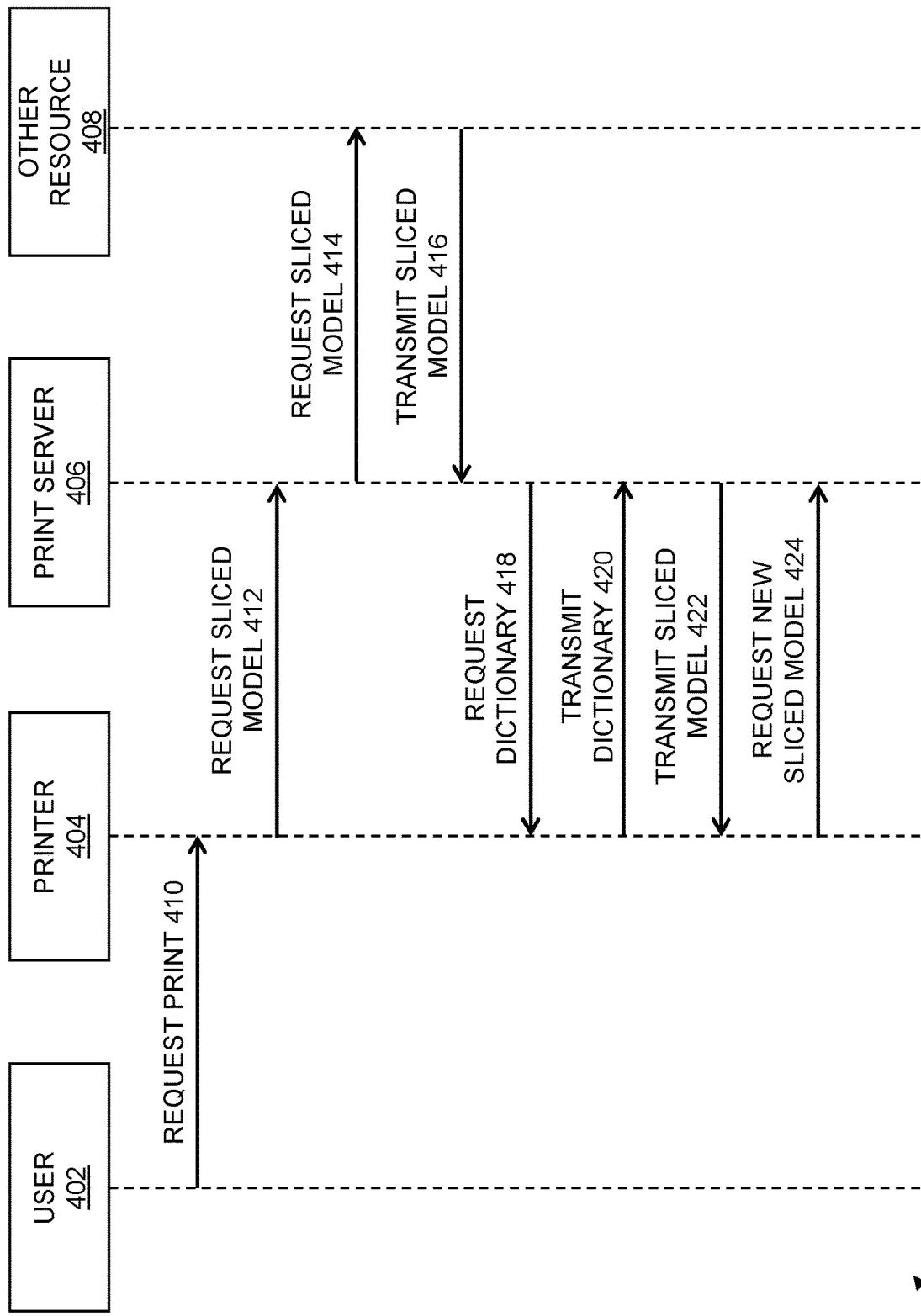
FIG. 4 is a sequence diagram of a system for providing machine-ready models based on printer configuration.

FIG. 4 is a sequence diagram of a system for providing machine-ready models based on printer configuration. Specifically, FIG. 4 shows a system 400 having a user 402, a printer 404, and a print server 406. The system 400 may also include other resources 408. In general, FIG. 4 shows an example of communications that may be present in the system 400 for yielding a machine-ready model based on the configuration of the printer 404. The parties in the system 400 of FIG. 4 may be connected via a network, locally connected, or otherwise may be in communication with one another. It will be understood that the embodiment of FIG. 4 is provided by way of example only, and that numerous techniques may be used to synchronize operation of a printer and various remote resources such as remote slicing engines or model repositories as contemplated herein.

The user 400 may be a user of the printer 404, a client or user of the print server 406 or other resource 408, a user of a service that provides machine-ready models, or generally any party that uses the printer 404 or otherwise wants to obtain a machine-ready model.

The printer 404 and print server 406 may be any of the printers and servers as described herein or otherwise known in the art. The print server 406 may also or instead include client devices, mobile devices, and the like, or the print server 406 may be incorporated into or in communication with such devices. In this manner, sliced models as discussed herein may be created or selected by client devices, mobile devices, and the like.

The other resource 408 may include a cloud-based service, a webpage, an application, another server, another printer, another user, a database, and so forth. The other resource 408 may be local or remote to one or more of the other components of the system 400. The other resource 408 may include a plurality of other resources. The other resource 408 may also or include any of the other resources described elsewhere herein, e.g., with reference to FIG. 2.

As shown by arrow 410, the user 402 may send a request to the printer 404 requesting a print of an object. The user 402 may also or instead send such a request to another component or device that controls the printer 404. This request may be generated from a user interface on a computer locally coupled to the printer 404, or remotely through a remote print management website or the like.

As shown by arrow 412, upon receiving the request for a print, the printer 404 may request a sliced model from the print server 406. This request may also or instead be sent directly from the user 402. This request may also or instead be sent to another component of the system 400, e.g., the other resource 408. The print server 406 may select or generate a sliced model based on this request, or it may request additional information for selecting or generating a sliced model based on this request. The sliced model may be a machine-ready model, i.e., a model that is suitable for use by the printer 404 in fabricating the object.

As shown by arrow 414, the print server 406 may request the sliced model from the other resource 408. For example, if the other resource 408 includes a database of sliced models, the print server 406 may request a particular sliced model from this database. In response to this request, the other resource 408 may search for and select a sliced model, or the other resource 408 may generate a sliced model.

As shown by arrow 416, the other resource may transmit a sliced model to the print server 406 in response to its request. The sliced model may also or instead be sent to another component of the system 400, e.g., the printer 404 or user 402.

As shown by arrow 418, the print server 406 may request a dictionary from the printer 404. The dictionary may include any as described herein. For example, the dictionary may include one or more properties of the printer 404. This request may also or instead be sent to another component of the system 400, e.g., the user 402. The request for a dictionary may be automatically sent upon receiving a request for a sliced model. Alternatively, the request for a dictionary may be sent only upon determining that there are not any suitable sliced models for the printer 404. This determination may be made at the print server 406, the other resource 408, or any combination thereof.

As shown by arrow 420, the printer 404 may transmit the dictionary to the print server. Alternatively, another component of the system 400 may transmit the dictionary to the print server, e.g., the user 402 or the other resource 408. The dictionary may also or instead be transmitted to another component of the system 400, e.g., the user 402 or the other resource 408. The dictionary may be transmitted upon the request for the dictionary, or the dictionary may be automatically transmitted when requesting a sliced model. Once the dictionary is received, it may be stored (e.g., on the print server 406 or the other resource 408) and tagged such that it need not be transmitted again. Thus, the print server 406 or other resource 408 may include a plurality of stored dictionaries, where each dictionary may be associated with a particular printer.

As shown by arrow 422, the print server 406 may transmit the sliced model to the printer 404. The sliced model may also or instead be sent to another component of the system 400, e.g., the user 402. The sliced model may also or instead be sent from another component of the system 400, e.g., the other resource 408. The sliced model may be the machine-ready representation selected or generated by the print server 406 or another component of the system 400 to be used by the printer 404 in fabricating the object.

As shown by arrow 424, the printer 404 may request a new sliced model from the print server 406, e.g., if there are errors with the received sliced model. Thus, upon receipt of the sliced model, the printer 404 or another component of the system 400 may error check the sliced model, or otherwise test the sliced model for suitability in fabricating the object. If errors are detected or the sliced model is otherwise unsuitable, the request for a new sliced model may be sent. This request may also or instead be sent by another component of the system 400, e.g., the user 402. This request may also or instead be sent to another component of the system 400, e.g., the other resource 408.

Figure 5:
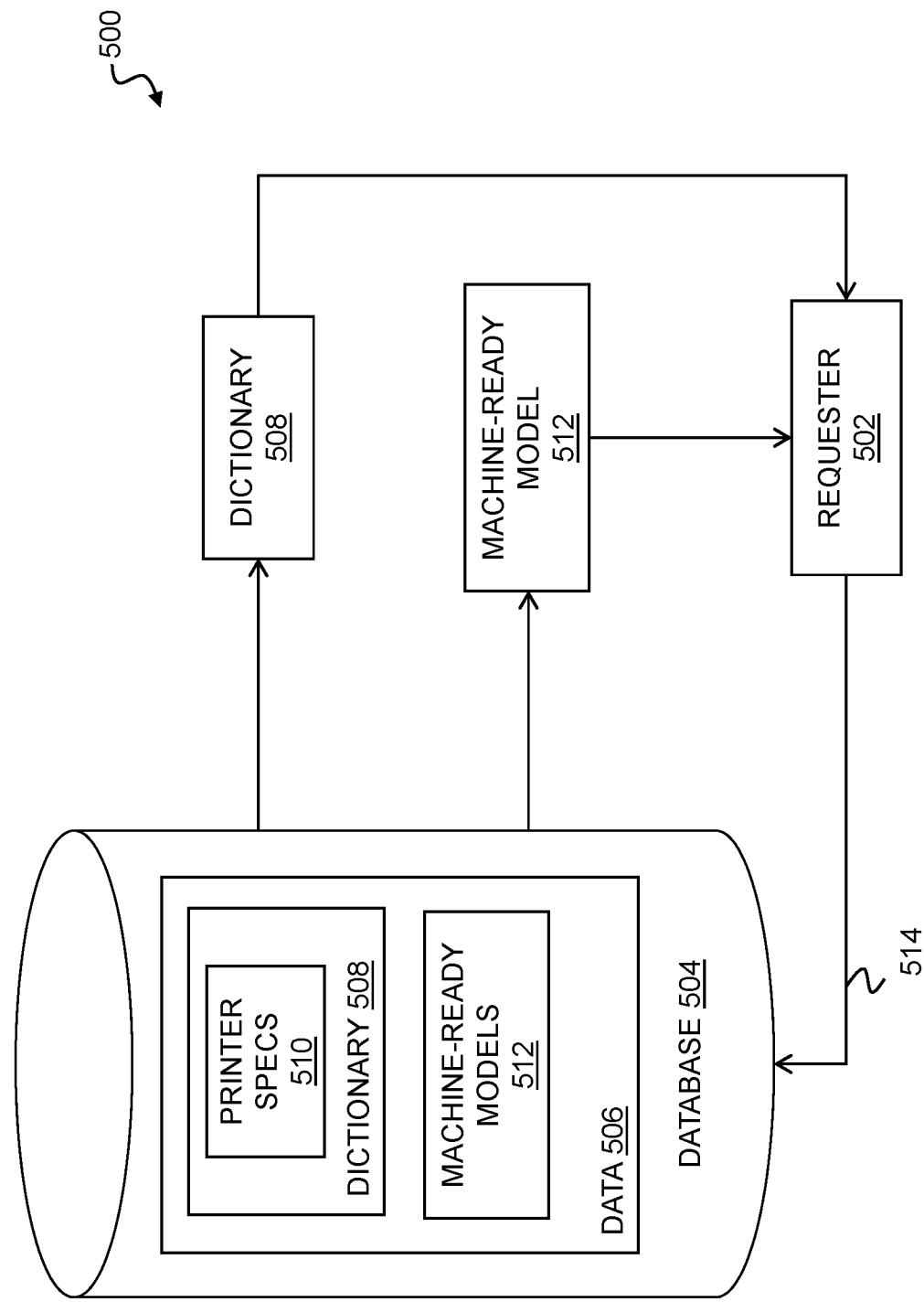
FIG. 5 illustrates a system for providing dictionaries and machine-ready models.

FIG. 5 illustrates a system for providing dictionaries and machine-ready models. One skilled in the art will recognize that FIG. 5 illustrates one possibility out of numerous possibilities for such a system 500. The main components of the system 500 may include a requester 502 and a database 504. The requester 502 and the database 504 may be in communication with one another, e.g., through a network.

The requester 502 may include without limitation a client or user as described herein or as known in the art. The requester 502 may also or instead include a device operated by a client or user, where the device is in communication with one or more of the database 504, a printer, a print server, another resource, and so on. In one aspect, the requester 502 is the printer. In another aspect, the requester 502 is the print server. The requester 502 may send a request or query (illustrated by arrow 514) to the database 504. The request may include without limitation a request for a dictionary 508 or a request for a machine-ready model 512. The requester 502 may send the request in response to a print request or as part of a print request.

The database 504 may include stored data 506. The stored data 506 may include one or more dictionaries 508 and one or more machine ready models 512.

The dictionaries 508 may include any of the dictionaries described herein. For example, the dictionary 510 may include printer specifications 510, e.g., specifications related to the configuration and capabilities of a printer. The dictionaries 508 may specify printer hardware, software, firmware, accessories, and the like at any useful level of granularity, and may, for example, be indexed according to printer identifiers so that the database 504 can be used to retrieve a dictionary based on a unique printer identifier. In another aspect, the dictionary may be stored on a printer (not shown) coupled to the system, or the dictionary may be dynamically created by a printer in response to a request for the dictionary based on an actual, current configuration detected for the printer. In another aspect, any combination of the foregoing may be use to capture an accurate representation of the target printer.

The machine-ready models 512 may include models that are suitable for use by a printer in fabricating an object. Any number of machine-ready models 512 may be provided for a particular object. Thus when an object and a target printer are specified in a print request, the database 504 may be queried to retrieve a suitable model to fabricate the object using the target printer. Although the dictionaries 508 and machine-ready models 512 are shown in the same database 504, one skilled in the art will recognize that they may be located in different, separate databases, or that there may be a plurality of databases including different dictionaries 508 and machine-ready models 512. The database 504 may be located on a printer, a print server, another resource, and so forth, as well as combinations of the foregoing. In response to the request from the requester 502, the database 504 (or a component operating the database 504) may send the requester 504 the requested data, e.g., one or both of the dictionary 508 and the machine ready model 512.

Figure 6:
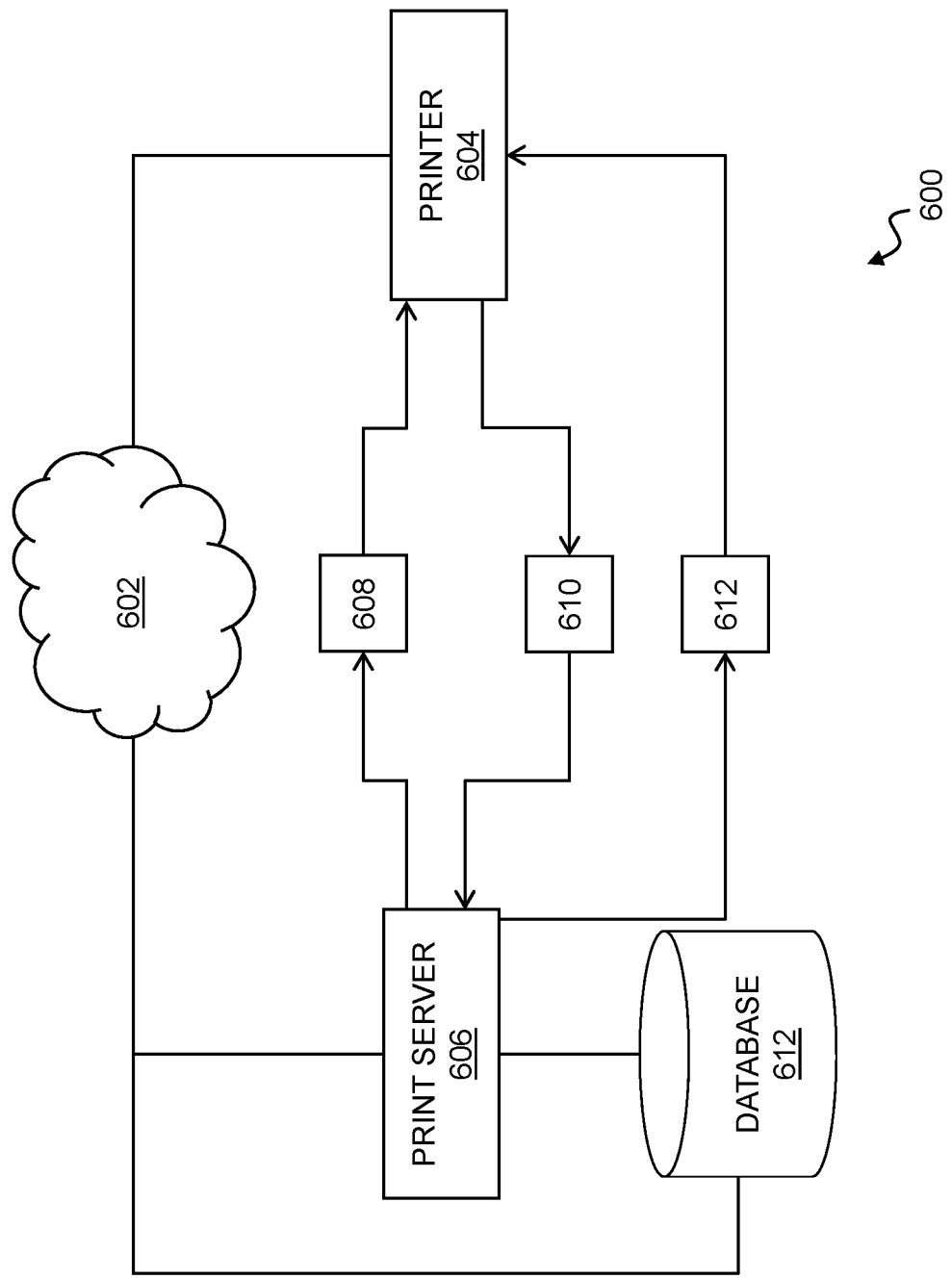
FIG. 6 illustrates a system for providing machine-ready models based on printer configuration.

FIG. 6 illustrates a system for providing machine-ready models based on printer configuration. Once again, one skilled in the art will recognize that FIG. 6 illustrates one possibility out of numerous possibilities for such a system

600. As shown in FIG. 6, the system 600 may include a network 602 interconnecting a printer 604 and a print server 606. In general, the network 602, printer 604, and print server 606 may be any as described herein.

As shown in FIG. 6, in operation, the print server 606 may send a query 608 to the printer 604. The query 608 may include a request for the printing capabilities or printing configuration (e.g., a dictionary) of the printer 604. In response, the printer 604 may respond by sending the print server 606 an answer 610. The answer 610 may include a dictionary as described herein for the printer 604. Based on the information included in the answer 610, the print server 606 may send the printer 604 an asset 612. The asset 612 may include without limitation a machine-ready representation of a three-dimensional model executable by the printer 604, instructions for printing, a fabrication profile, and so forth. Before sending the asset 612, the print server 606 may develop, generate, select, modify, etc., the asset 612, which may be done internally on the print server 606 or with the aid of an external resource such as a database 614. For example, in one aspect, the print server 606 uses a dictionary included in the answer 610 to create a fabrication profile, which the print server 606 or an external resource then uses to generate a machine-ready representation of a three-dimensional model executable by the printer 604. The machine-ready representation is then sent to the printer 604 as the asset 612.

The database 614 may be located on the print server 606 or be an external resource to the print server 606. The print server 606 may thus be in communication with the database 614 through the network 602. The database 614 may include a plurality of dictionaries, machine-ready models, or the like for use by the print server 606. The print server 606 may also or instead supply the database 614 with dictionaries, machine-ready models, or other information.

The above systems, devices, and methods described herein may be used to supplement current systems for three-dimensional fabrication. For example, the techniques described herein may be used in systems where users print from libraries (e.g., online databases), print purchased files (e.g., from online stores or services providing machine-ready models), print from applications running on their computers or mobile devices, when importing or exporting files, and so forth. The techniques described herein may be used to ensure that clients are using suitable machine-ready models for their particular printer configuration when printing.

The above systems, devices, and methods described herein may be used in networked printers, where printers will automatically send their configuration information and receive machine-ready models based on the configuration information. In another aspect, non-networked printers may provide configuration information and receive machine-ready models through external devices, e.g., Universal Serial Bus (USB) devices or the like, or by using configuration programming local to their machine. For example, a user interface or application running on the printer or a computer/device connected to the printer may include an option to copy configuration data to a USB flash drive or the like. A user may then use the USB flash drive to load the configuration into a print server, application, webpage, or the like. An alternate embodiment may include a user entering configuration data into a GUI for a print server or the like. The configuration data may be entered using profile codes or the like, where profile codes are associated with a printer configuration. A database may thus maintain the profile codes mapped to particular configuration data.

In one aspect, a printer captures its properties, e.g., in a dictionary or the like, and provides the dictionary to a three-dimensional printing service. The three-dimensional printing service may include a slicing engine, where the slicing engine may only being to slice a three-dimensional model after receiving the dictionary from the printer. The sliced model (or machine-ready model) may include the configuration information, e.g., the dictionary. The sliced model may also or instead include a link or path (e.g., a URL) to the original three-dimensional model. Firmware included on the printer may issue a warning if the sliced model does not match the configuration of the printer. Firmware included on the printer may attempt to use the three-dimensional printing service (e.g., via a cloud service or the like) to correct the sliced model if the sliced model does not match the configuration of the printer. This correction may include without limitation attempting to use another sliced model, the original three-dimensional model, re-slicing the original three-dimensional model, or modifying the sliced model. A user of the printer may save their configuration with the three-dimensional printing service so that future sliced models may be provided based on the configuration of the printer. In this manner, a printer may have a saved profile of its configuration. A user of the printer may also be able to reconfigure and reset their printer's profile. A printer's profile may also or instead be automatically created at the time of manufacturing of the printer.

In one aspect, a printer (or properties thereof, e.g., the dictionary) may require authenticating before the printer can obtain a machine-ready model. In another aspect, a printer's dictionary is stored on a print server or database in communication with the print server, and the stored dictionary may be updated when the printer connects to the print server. The update may be an automatic update, a manual update, a scheduled update, and so forth. In yet another aspect, a user may have an account with a print server or the like, where the user can save printer dictionaries and machine-ready models for a plurality of printers. Printer dictionaries and machine-ready models may also or instead be saved locally by a user or client.

In an implementation, if a printer is connected to a print server, the configuration of the printer is automatically sent to the print server. In this instance, when a user connects a printer to a print server for the first time, the user may be prompted to name or label the printer or configuration. Based on the print server's experience with the make and model of the printer, certain data may be known simply from the connection without the transfer of a dictionary or the like. In other instances, the dictionary may provide configuration information to the print server. If the print server needs additional information, a user may be prompted to input or select such information. Configurations and printers may also be saved on the print server or a component thereof, such that a user may access this information, e.g., using a GUI or the like. A print server or database connected thereto may provide a user with three-dimensional models for selection, where the models have associated machine-ready representations for different printers. A user of such a system with a saved profile may be able to select a three-dimensional model for printing, and the print server may automatically choose a machine-ready representation based on the user's or printer's profile. Alternatively, a print server may be able to create machine-ready representations of the three-dimensional models selected by the user based on the user's or printer's profile. If a user has more than one printer associated with their profile, they may select which printer they want the machine-ready representation to be executed on to print a selected three-dimensional model.

The techniques described herein may assist in providing accurate print time estimation because the configurations of particular printers will be known to a print server. For example, a printer's configuration may provide a printing estimator with relevant acceleration parameters and the estimator can compute accelerated print times accordingly. Acceleration parameters may also be useful for slicer computations for variable layer height.

As described above, a slicer may utilize the configuration information of the printers in creating machine-ready models. By way of example and not of limitation, the configuration information may be parsed by the slicer in the following ways: the slicer may maintain configurations as a set of layered style sheet type overrides; the slicer may maintain a function, script, or the like that manipulates a base profile based on some simple logic keyed from the configuration; or some combination thereof. The slicer may utilize an algorithm that computes a toolpath for a given dictionary.

Several use cases of the techniques described herein will now be discussed. After obtaining a machine-ready representation of a three-dimensional model of an object, a user may print the object one or more times. In one aspect, the user may not need to obtain another machine-ready representation for printing the object, but can re-use the one already received. If the user in this scenario switched printers, or switched their printer's configuration, the system may automatically recognize that the user has done so when attempting to use the machine-ready representation on the new printer or configuration. This may be accomplished through an error check or compatibility check performed by a component of the system, e.g., the printer or the print server. If the machine-ready representation is unsuitable for the new printer or configuration, the system may stop the user from using the machine-ready representation (e.g., through a notification or the like), or the machine-ready representation may simply not function with the printer. In one aspect, the new printer or new configuration may also be compatible with the machine-ready representation and a new machine-ready representation may not be required. In another aspect, the new printer or new configuration may not be compatible with the machine-ready representation and a new machine-ready representation may be required. In such a use case, the system may begin a process to obtain a new suitable machine-ready representation for the new printer or configuration. The process may occur automatically, or the user may initiate the process. In one aspect, the process for obtaining a new suitable machine-ready representation for the new printer or configuration occurs automatically, and no error notification is sent, so the user has no direct knowledge that a new representation was needed and was obtained.

In another use case, the system may adapt the printer or the machine-ready representation instead of obtaining a new machine-ready representation for a new printer or configuration. For example, the printer can adapt itself (or a user can adapt the printer) to become compatible with a machine-ready representation. Such adaptations may include changes to print speed and the like.

The above systems, devices, methods, processes, and the like may be realized in hardware, software, or any combination of these suitable for the control, data acquisition, and data processing described herein. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software. At the same time, processing may be distributed across devices such as the various systems described above, or all of the functionality may be integrated into a dedicated, standalone device. All such permutations and combinations are intended to fall within the scope of the present disclosure.

Embodiments disclosed herein may include computer program products comprising non-transitory computer-executable code or computer-usable code that, when executing on one or more computing devices, performs any and/or all of the steps of the control systems described above. The code may be stored in a non-transitory fashion in a computer memory, which may be a memory from which the program executes (such as random access memory associated with a processor), or a storage device such as a disk drive, flash memory or any other optical, electromagnetic, magnetic, infrared or other device or combination of devices. In another aspect, any of the control systems or the like described above may be embodied in any suitable transmission or propagation medium carrying computer-executable code and/or any inputs or outputs from same.

It will be appreciated that the devices, systems, and methods described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing the step of X includes any suitable method for causing another party such as a remote user, a remote processing resource (e.g., a server or cloud computer) or a machine to perform the step of X. Similarly, performing steps X, Y and Z may include any method of directing or controlling any combination of such other individuals or resources to perform steps X, Y and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. A system comprising:
   a print server coupled through a data network to a plurality of three-dimensional printers, the print server configured to receive a request to fabricate an object from a three-dimensional model, determine a target printer from the plurality of three-dimensional printers to fabricate the object, query the target printer for configuration information of the target printer including configuration information relevant to creation by a slicing engine of a printable model for fabrication of the object on the target printer, receive a dictionary of configuration information containing one or more properties of the target printer that affect fabrication capabilities of the target printer, create a fabrication profile for fabrication of the object on the target printer based on the one or more properties, the fabrication profile specifying one or more parameters of the printable model consistent with the fabrication capabilities of the target printer, and process the three-dimensional model with a slicing process according to the fabrication profile to generate a machine-ready representation of the processed three-dimensional model consistent with the fabrication capabilities of the target printer and executable by the target printer to fabricate the object based on the one or more properties; and
   a database coupled in a communicating relationship with the print server and configured to store at least one of the dictionary of configuration information, the fabrication profile, and the machine-ready representation.

2. The system of claim 1, further comprising a slicing engine in communication with the print server configured to carry out the slicing process according to the fabrication profile.

3. The system of claim 1, wherein the one or more properties include at least one customization made by a user to a hardware configuration or a software configuration of the target printer.

4. The system of claim 1, wherein the one or more properties include one or more of a user configuration, a user preference, and a hardware accessory added to the target printer by a user.

5. The system of claim 1, wherein determining a target printer includes use of one or more selection criteria including one or more of information related to the three-dimensional model, information related to the object, a print queue, a prioritization, a location of the target printer, a timeline, and an attribute of the target printer.

6. The system of claim 1, wherein the print server is further configured to transmit the machine-ready representation of the processed three-dimensional model to the target printer.

7. The system of claim 6, wherein one or more of the target printer and the print server is configured to compare metadata for the machine-ready representation to one or more printer properties in the dictionary to ensure that the machine-ready representation can be fabricated by the target printer.

8. The system of claim 1, wherein the one or more properties include a hardware configuration of the target printer.

9. The system of claim 8, wherein the hardware configuration includes one or more of an extruder type, an extruder nozzle diameter, a build volume, a build platform type, a hardware version number, a top speed for linear movement of a tool, a step size for movement of the tool, a minimum z-axis step size, a gantry type, and a build material type.

10. The system of claim 8, wherein the hardware configuration includes one or more of an automatically detected hardware reconfiguration and a manually specified hardware reconfiguration.

11. The system of claim 1, wherein the one or more properties include a software configuration of the target printer.

12. The system of claim 11, wherein the software configuration includes one or more of a version of a slicer used by the target printer and a version of a slicer that has previously created machine-ready representations of three-dimensional models for the target printer.

13. The system of claim 11, wherein the software configuration includes one or more slicer settings.

14. The system of claim 11, wherein the software configuration includes a firmware configuration of the target printer.

15. The system of claim 11, wherein the software configuration includes an application used to operate the target printer.

16. The system of claim 11, wherein the one or more properties include one or more user settings on the target printer.

17. The system of claim 16, wherein the one or more user settings include user settings from a previous fabrication process.

18. The system of claim 1, wherein the one or more properties include a build material in the target printer.

19. The system of claim 1, wherein one or more of the print server and the target printer is configured to check the machine-ready representation for errors, and request a new machine-ready representation when an error is detected.

20. The system of claim 1, wherein the print server is further configured to determine whether a suitable machine-ready model is available for the fabrication profile based on at least one of the one or more properties relevant to selection of a machine-ready model from a content source, and, when a suitable machine-ready model is available from the content source, to select the suitable machine-ready model for transmission to the target printer.

* * * * *